(12) United States Patent
Iwasawa et al.

(10) Patent No.: US 10,852,372 B2
(45) Date of Patent: Dec. 1, 2020

(54) ARRAY COIL AND MAGNETIC RESONANCE IMAGING APPARATUS

(71) Applicant: Hitachi, Ltd., Tokyo (JP)

(72) Inventors: Kohjiro Iwasawa, Tokyo (JP); Yosuke Otake, Tokyo (JP); Kazuyuki Kato, Tokyo (JP); Hisaaki Ochi, Tokyo (JP)

(73) Assignee: HITACHI, LTD., Tokyo (JP)

( * ) Notice: Subject to any disclaimer, the term of this patent is extended or adjusted under 35 U.S.C. 154(b) by 0 days.

(21) Appl. No.: 16/384,370

(22) Filed: Apr. 15, 2019

(65) Prior Publication Data

US 2019/0383891 A1  Dec. 19, 2019

(30) Foreign Application Priority Data

Jun. 18, 2018 (JP) ................................. 2018-115502

(51) Int. Cl.
*G01R 33/34* (2006.01)
*G01R 33/3415* (2006.01)
*G01R 33/36* (2006.01)

(52) U.S. Cl.
CPC ... *G01R 33/34084* (2013.01); *G01R 33/3415* (2013.01); *G01R 33/3642* (2013.01)

(58) Field of Classification Search
CPC .......... G01R 33/34084; G01R 33/3642; G01R 33/3415; G01R 33/3628
See application file for complete search history.

(56) References Cited

U.S. PATENT DOCUMENTS

| | | | | |
|---|---|---|---|---|
| 6,771,071 | B1* | 8/2004 | Wright | G01R 33/3415 324/318 |
| 10,184,997 | B2* | 1/2019 | Piferi | G01R 33/34 |
| 2005/0253582 | A1* | 11/2005 | Giaquinto | G01R 33/3415 324/318 |
| 2006/0132134 | A1* | 6/2006 | Amm | G01R 33/3415 324/318 |
| 2013/0093425 | A1* | 4/2013 | Chu | G01R 33/365 324/318 |

(Continued)

FOREIGN PATENT DOCUMENTS

JP  2017-508545 A  3/2017

OTHER PUBLICATIONS

Nordmeyer-Massner et al., "Stretchable Coil Arrays: Application to Knee Imaging Under Varying Flexion Angles," Magnetic Resonance in Medicine, vol. 67, 2012, pp. 872-879.

(Continued)

*Primary Examiner* — G. M. A Hyder
(74) *Attorney, Agent, or Firm* — Foley & Lardner LLP

(57) ABSTRACT

An MRI image with high image quality can be acquired regardless of a size of an examinee. An array coil includes: a coil unit in which a plurality of sub-coils which includes a loop coil portion in which a conductor having flexibility with a predetermined length is curved and which is adjusted to receive a magnetic resonance signal from an examinee are arranged at predetermined intervals; and a coil casing that is formed of a sheet-shaped material which expands and contracts in at least one direction and accommodates the coil unit therein. At least one position of each of the plurality of sub-coils is fixed to the coil casing and an inter-center distance between the sub-coils varies with expansion and contraction of the coil casing.

15 Claims, 15 Drawing Sheets

(56) References Cited

U.S. PATENT DOCUMENTS

| | | | |
|---|---|---|---|
| 2013/0137969 A1* | 5/2013 | Jones | A61B 5/055 600/421 |
| 2017/0067973 A1* | 3/2017 | Hyun | A61B 5/0555 |
| 2017/0095365 A1 | 4/2017 | Reese | |
| 2018/0180690 A1* | 6/2018 | Otake | A61B 5/0555 |
| 2018/0263561 A1* | 9/2018 | Jones | A61B 5/6831 |
| 2019/0154773 A1* | 5/2019 | Stack | G01R 33/3415 |

OTHER PUBLICATIONS

Vasanawala et al., "Development and Clinical Implementation of Very Light Weight and Highly Flexible AIR Technology Arrays," Proceedings of the 25th Annual Meeting of International Society for Magnetic Resonance in Medicine, 2017, p. 755 (3 printed pages).

* cited by examiner

ARRAY COIL AND MAGNETIC RESONANCE IMAGING APPARATUS

BACKGROUND OF THE INVENTION

Field of the Invention

The present invention relates to a radio-frequency (RF) coil that detects a nuclear magnetic resonance signal by emitting an RF magnetic field and a magnetic resonance imaging (MRI) apparatus that acquires a tomographic image on the basis of the nuclear magnetic resonance signal detected by the RF coil.

Description of the Related Art

An MRI apparatus is a medical image diagnosis apparatus that applies an RF magnetic field to an examinee as an examination object placed in a magnetic field (a static magnetic field) which is spatially uniform to generate nuclear magnetic resonance in nuclear spins in an arbitrary section crossing the examinee and acquires a tomographic image in the section from a nuclear magnetic resonance signal which is generated in response thereto. Such an MRI apparatus is referred to as a horizontal magnetic field type MRI apparatus or a vertical magnetic field type MRI apparatus depending on the direction of the static magnetic field.

In MRI imaging, an examinee placed in a static magnetic field is irradiated with an RF magnetic field using an RF coil while applying a gradient magnetic field thereto. Nuclear spins, for example, nuclear spins of hydrogen atoms, in the examinee are excited by irradiation with the RF magnetic field and a circularly polarized magnetic field is generated as a nuclear magnetic resonance signal when the excited nuclear spins return to an equilibrium state. This signal is detected by the RF coil and signal processing is performed thereon to image a hydrogen nucleus distribution in a living body.

The RF coil is roughly classified into a volume coil and a surface coil depending on its shape. In general, a volume coil that can uniformly irradiate a broad range is used as an RF coil (a transmitting coil) that emits an RF magnetic field. On the other hand, a surface oil that can be disposed in the vicinity of an examinee is used as an RE coil (a receiving coil) that detects a signal. This is because signal acquisition efficiency becomes higher and the image quality of an MRI image is more improved as a distance between the RF coil and an examinee becomes less.

In general, a receiving coil includes a rigid coil casing with priority given to durability thereof that is formed to correspond to a shape of an imaging target in advance. On the other hand, a flexible receiving coil that can be disposed in the vicinity of an examinee along a biological structure of the examinee has been proposed recently (for example, see JP-T-2017-508545, S. S. Vasanawala et al., "Development and Clinical Implementation of Very Light Weight and Highly Flexible AIR Technology Arrays," (Proceedings of the 25th Annual Meeting of International Society for Magnetic Resonance in Medicine), p. 755 (2017), and J. A. Nordmeyer-Massner et al., "Stretchable Coil Arrays: Application to Knee Imaging Under Varying Flexion Angles," (Magnetic Resonance in Medicine), Vol. 67, pp. 872-879 (2012)). In JP-T-2017-508545 and S. S. Vasanawala et al., "Development and Clinical Implementation of Very Light Weight and Highly Flexible AIR Technology Arrays," (Proceedings of the 25th Annual Meeting of International Society for Magnetic Resonance in Medicine), p. 755 (2017), it is disclosed that a receiving coil is arranged along a biological structure of an examinee by applying a receiving coil in which a plurality of coil elements which are bendable flexible coils are combined as the receiving coil. In J. A. Nordmeyer-Massner et al., "Stretchable Coil Arrays: Application to Knee Imaging Under Varying Flexion Angles," (Magnetic Resonance in Medicine), Vol. 67, pp. 872-879 (2012), it is disclosed that a stretchable conductor is used for a receiving coil.

However, in the receiving coil disclosed in JP-T-2017-508545 or S. S. Vasanawala et al., "Development and Clinical Implementation of Very Light Weight and Highly Flexible AIR Technology Arrays," (Proceedings of the 25th Annual Meeting of International Society for Magnetic Resonance in Medicine), p. 755 (2017), since a distance between both ends of the receiving coil (a coil length) is fixed, a decrease in image quality is caused when a size of an examinee is not suitable for the coil size. As an example of the coil size relative to an examinee size, FIGS. 16A to 16C illustrate a sectional view perpendicular to a body axis direction of an examinee which is associated with an arrangement example when a flexible coil with a fixed coil length is arranged with respect to abdominal regions of examinees having different sizes.

FIG. 16A illustrates a sectional view (the left part) and a positional relationship between some sub-coils 1410 when an examinee size is less than a coil length, FIG. 16B illustrates a sectional view (the left part) and a positional relationship between some sub-coils 1410 when an examinee size is suitable for a coil length, and FIG. 16C illustrates a sectional view (the left part) and a positional relationship between some sub-coils 1410 when an examinee size is greater than a coil length.

A sub-coil 1410 maintains an overlapping area with a neighboring sub-coil constant regardless of the examinee size. In FIGS. 16A to 160, an examinee is lying on the examinee's back, a negative y-axis direction is directed to an abdomen side, and a positive y-axis direction is directed to a back side. A flexible coil 1400 is disposed on the abdomen of the examinee, and a spinal receiving coil 190 built in a bed is disposed on the back side.

When the examinee size is suitable for the coil length as illustrated in FIG. 16B, the surrounding of an abdominal section of an examination object 103B can be exactly covered by the flexible coil 1400 and the spinal receiving coil 190. On the other hand, when the examinee size is less than the coil length as illustrated in FIG. 16A, a part 1500 in which the flexible coil 1400 and the spinal receiving coil 190 overlap each other is formed. Due to the overlapping part 1500, the flexible coil 1400 and the spinal receiving coil 190 cause deterioration in coil performance based on magnetic coupling and the image quality of an MRI image decreases. When the examinee size is greater, a gap 1600 is formed between the flexible coil 1400 and the spinal receiving coil 190. A signal loss is generated in the vicinity of the gap 1600 and the image quality of an MRI image decreases.

In the receiving coil with a fixed coil length disclosed in JP-T-2017-508545 or S. S. Vasanawala et al., "Development and Clinical Implementation of Very Light Weight and Highly Flexible AIR Technology Arrays," (Proceedings of the 25th Annual Meeting of International Society for Magnetic Resonance in Medicine), p. 755 (2017), folding of the coil casing is required when a three-dimensional curved surface is covered, and the coil casing cannot be disposed completely close to a biological structure of an examinee.

In the receiving coil formed of a stretchable conductor disclosed in J. A. Nordmeyer-Massner et al., "Stretchable Coil Arrays: Application to Knee Imaging Under Varying Flexion Angles," (Magnetic Resonance in Medicine), Vol. 67, pp. 872-879 (2012), shift in resonance frequency or deterioration of a conductor is caused with expansion or contraction of the conductor and thus a decrease in image quality is caused.

SUMMARY OF THE INVENTION

The invention was made in consideration of the above-mentioned circumstances and an objective thereof is to acquire an MRI image with high image quality regardless of a size of an examinee.

The invention provides the following configurations to achieve the above-mentioned objective.

According to an aspect of the invention, there is provided an array coil including: a coil unit in which a plurality of sub-coils which includes a loop coil portion in which a conductor having flexibility with a predetermined length is curved and which is adjusted to receive a magnetic resonance signal from an examinee are arranged at predetermined intervals; and a coil casing that is formed of a material which expands and contracts in at least one direction and accommodates the coil unit therein, in which at least one position of each of the plurality of sub-coils is fixed to the coil casing and an inter-center distance between the sub-coils varies with expansion and contraction of the coil casing.

According to another aspect of the invention, there is provided a magnetic resonance imaging apparatus including: a static magnetic field forming unit that forms a static magnetic field; a gradient magnetic field forming unit that forms a gradient magnetic field; a transmitting RF coil that irradiates an examination object placed in the static magnetic field with an RF magnetic field; a receiving RF coil that detects a nuclear magnetic resonance signal from the examination object; and a signal processing unit that processes the nuclear magnetic resonance signal detected by the receiving RF coil, in which the receiving RF coil is the array coil.

According to the invention, it is possible to acquire an MRI image with high image quality regardless of a size of an examinee.

BRIEF DESCRIPTION OF THE DRAWINGS

FIG. 1A illustrates an appearance of a horizontal magnetic field type MRI apparatus and FIG. 1B illustrates an appearance of a vertical magnetic field type MRI apparatus;

FIG. 5A is a circuit diagram of the whole sub-coil, FIG. 5B is a circuit diagram of a transmitting-receiving magnetic coupling preventing circuit and a magnetic coupling preventing circuit driving device in the sub-coil, and FIG. 5C is a circuit diagram illustrating a modified example of the transmitting-receiving magnetic coupling preventing circuit;

FIG. 7A is a sectional view perpendicular to a body axis direction when an examinee size is less than a coil length and FIG. 7B is a diagram illustrating an example of an inter-center distance between sub-coils;

FIG. 8A is a sectional view perpendicular to a body axis direction when an examinee size is suitable for a coil length and FIG. 8B is a diagram illustrating an example of an inter-center distance between sub-coils;

FIG. 9A is a sectional view perpendicular to a body axis direction when an examinee size is greater than a coil length and FIG. 9B is a diagram illustrating an example of an inter-center distance between sub-coils;

FIG. 10A is a front view and FIG. 10B is a sectional view;

FIG. 11A is a diagram illustrating an arrangement example of sub-coils when a coil casing contracts and FIG. 11B is a diagram illustrating an arrangement example of sub-coils when the coil casing expands;

FIG. 16A illustrates a sectional view (the left part) and a positional relationship between some sub-coils when an examinee size is less than a coil length, FIG. 16O illustrates a sectional view (the left part) and a positional relationship between some sub-coils when an examinee size is greater than a coil length.

DETAILED DESCRIPTION OF THE INVENTION

First Embodiment

Figure 1A:
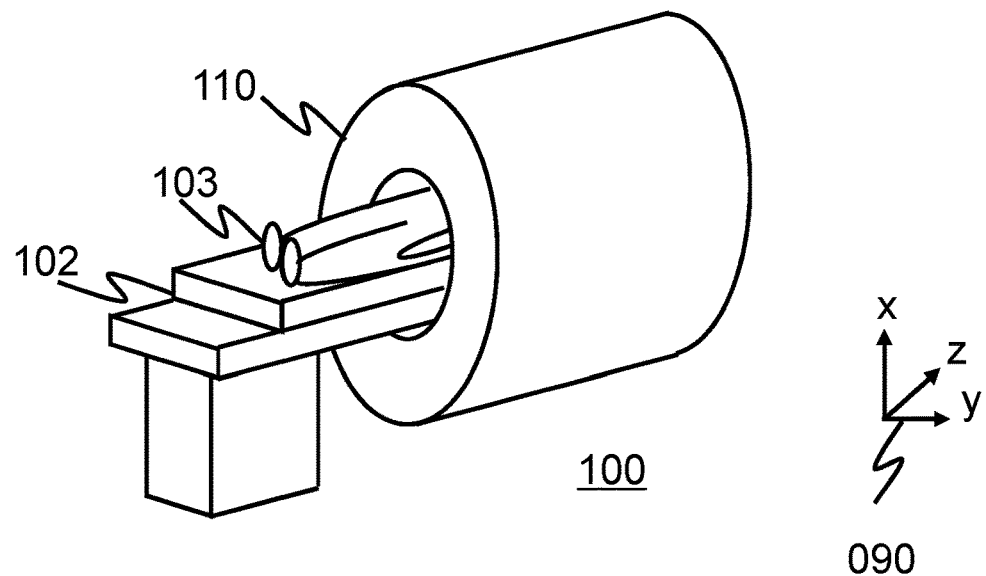
FIGS. 1A and 1B are diagrams illustrating an appearance of an MRI apparatus according to a first embodiment of the invention, where

Hereinafter, an MRI apparatus to which an RF coil (an array coil) according to a first embodiment of the invention is applied will be described with reference to the accompanying drawings. In the drawings associated with embodiments and examples, the same elements will be referred to by the same reference signs and description thereof will not be repeated.

<Entire Configuration of MRI Apparatus>

First, an MRI apparatus to which an RF coil according to the embodiment can be applied will be described below.

Figure 1B:
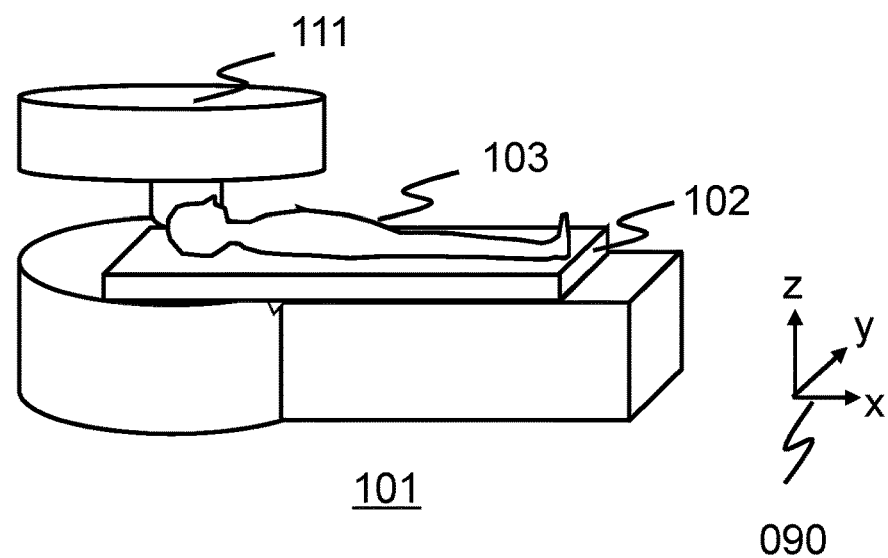

FIGS. 1A and 1B illustrate appearances of examples of the MRI apparatus. Particularly, FIG. 1A illustrates a horizontal magnetic field type MRI apparatus 100 using a tunnel magnet 110 that generates a static magnetic field using a solenoid coil.

FIG. 1B illustrates an open vertical magnetic field type MRI apparatus 101 in which a magnet 111 is separated vertically to enhance openness.

These MIR apparatuses 100 and 101 include a table 102 on which an examination object (an examinee) 103 is placed. In a state in which the examinee 103 is placed on the table, the examinee is arranged in an examination space in which a uniform magnetic field (a static magnetic field) is generated by the magnet 110 or 111. The magnet 110 or 111 constitutes a static magnetic field forming unit that forms a static magnetic field.

A so-called multichannel RF coil including a plurality of coil units can be applied to these MRI apparatuses and the RF coil according to the embodiment can also be applied to any of the horizontal magnetic field type MRI apparatus 100 and the vertical magnetic field type MRI apparatus 101.

The MRI apparatuses illustrated in FIGS. 1A and 1B are merely examples, and the invention can employ various known MRI apparatuses regardless of the form or type of the apparatuses. In the following description, a coordinate system 090 in which a static magnetic field direction is defined as a z direction and two directions perpendicular thereto are defined as an x direction and a y direction is used as a coordinate system which is common to the horizontal magnetic field type and the vertical magnetic field type.

An example in which a horizontal magnetic field type MRI apparatus is applied to the embodiment will be described below to describe a schematic configuration of the MRI apparatus 100.

Figure 2:
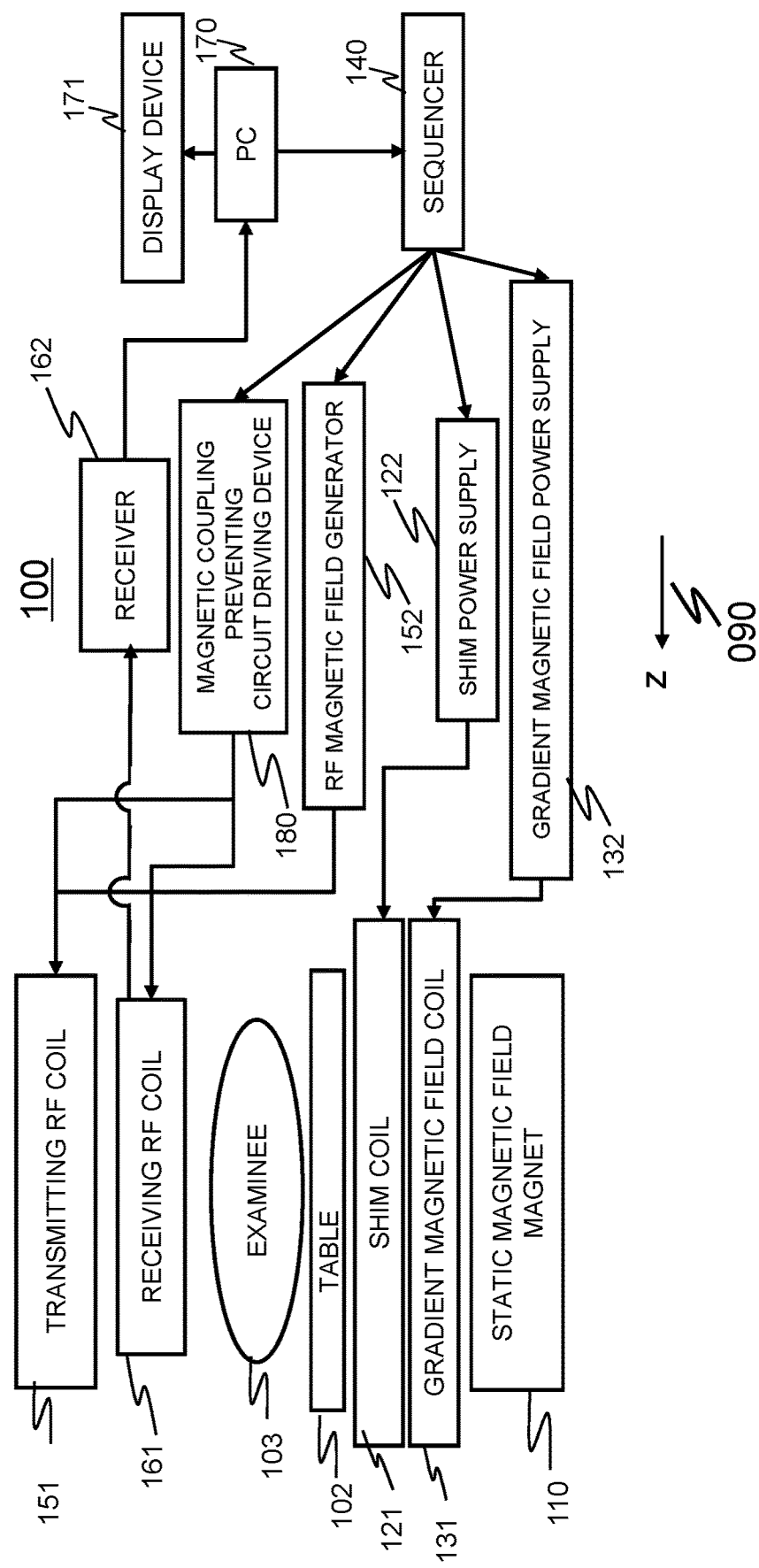
FIG. 2 is a block diagram schematically illustrating a configuration of the MRI apparatus.

As illustrated in FIG. 2, the MRI apparatus 100 includes a horizontal magnetic field type magnet (a static magnetic field magnet) 110, a gradient magnetic field coil 131, a transmitting RF coil 151, a receiving RF coil 161, a gradient magnetic field power supply 132, a shim coil 121, a shim power supply 122, an RF magnetic field generator 152, a receiver 162, a magnetic coupling preventing circuit driving device 180, a computer (PC) 170, a sequencer 140, and a display device 171. Reference numeral 102 denotes a table on which an examination object (an examinee) 103 is placed.

The gradient magnetic field coil 131 is connected to the gradient magnetic field power supply 132 and generates a gradient magnetic field. The gradient magnetic field coil 131 and the gradient magnetic field power supply 132 constitute a gradient magnetic field forming unit that forms a gradient magnetic field. The shim coil 121 is connected to the shim power supply 122 and adjusts uniformity of a magnetic field. The transmitting RF coil 151 is connected to the RF magnetic field generator 152 and applies (transmits) an RF magnetic field to an examinee 103.

The receiving RF coil 161 is connected to the receiver 162 and receives a nuclear magnetic resonance signal from the examinee 103. Here, a multichannel RF coil (hereinafter referred to as an array coil) including a coil unit including a plurality of sub-coils is applied as the receiving RF coil 161 according to this embodiment. In the following description, it is assumed that the number of sub-coils constituting the array coil and the number of channels are the same. Details of the array coil as the receiving RF coil 161 will be described later.

The magnetic coupling preventing circuit driving device 180 is connected to a magnetic coupling preventing circuit (which will be described later). The magnetic coupling preventing circuit is a circuit that is connected to the transmitting RF coil 151 and the receiving RP coil 161 and prevents magnetic coupling between the transmitting RP coil 151 and the receiving RP coil 161.

The sequencer 140 sends commands to the gradient magnetic field power supply 132, the RF magnetic field generator 152, and the magnetic coupling preventing circuit driving device 180 to operate them. A command is issued in accordance with an instruction from the computer (PC) 170. In accordance with an instruction from the computer (PC) 170, a magnetic resonance frequency which serves as a reference for detection is set by the receiver 162. For example, in accordance with a command from the sequencer 140, an RF magnetic field is applied to the examinee 103 via the transmitting RF coil 151. A nuclear magnetic resonance signal which is generated from the examinee 103 in response to application of the RF magnetic field is detected by the receiving RF coil 161 and detection thereof is performed by the receiver 162.

The computer (PC) 170 performs control of the entire operation of the MRI apparatus 100 and various signal processing. For example, the computer (PC) 170 receives a signal detected by the receiver 162 via an A/D conversion circuit and performs signal processing such as image reconstruction (a function of an image reconstructing unit). The result is displayed on the display device 171. The detected signals or measuring conditions are stored in a storage medium if necessary. The computer (PC) 170 causes the sequencer 140 to issue a command such that the devices operate at pre-programmed times and strength. When it is necessary to adjust static magnetic field uniformity, the computer (PC) 170 causes the sequencer 140 to issue a command to the shim power supply 122 such that the shim coil 121 adjusts the static magnetic field uniformity.

<Outline of Transmitting RF Coil and Receiving RF Coil>

As described above, two types of RF coils such as the transmitting RF coil 151 and the receiving RF coil 161 are used in the MRI apparatus. Regarding the transmitting RF coil 151 and the receiving RF coil 161, one RF coil may serve as both RF coils or separate RF coils may be used.

A case in which the transmitting RF coil 151 and the receiving RF coil 161 are separate coils, the transmitting RF coil 151 is an RF coil having a birdcage shape (a birdcage RF coil), and the receiving RF coil 161 is a multichannel array coil including a plurality of RF coils will be exemplified below to describe details of the RF coils.

The resonance frequency of the transmitting RF coil 151 is adjusted to a resonance frequency of an element to be excited. In this embodiment, the resonance frequency is adjusted to a magnetic resonance frequency of a hydrogen nucleus at which hydrogen nuclei can be excited. The receiving RF coil 161 is adjusted to detect a nuclear magnetic resonance signal which can be excited by the transmitting RF coil 151.

First, the arrangement of a birdcage RF coil 300 which is used as the transmitting RF coil 151 and an array coil 400 which is used as the receiving RF coil 161 and connection forms of the birdcage RF coil 300, the array coil 400, the RF magnetic field generator 152, the receiver 162, and the magnetic coupling preventing circuit driving device 180 will be described with reference to FIG. 3.

Figure 3:
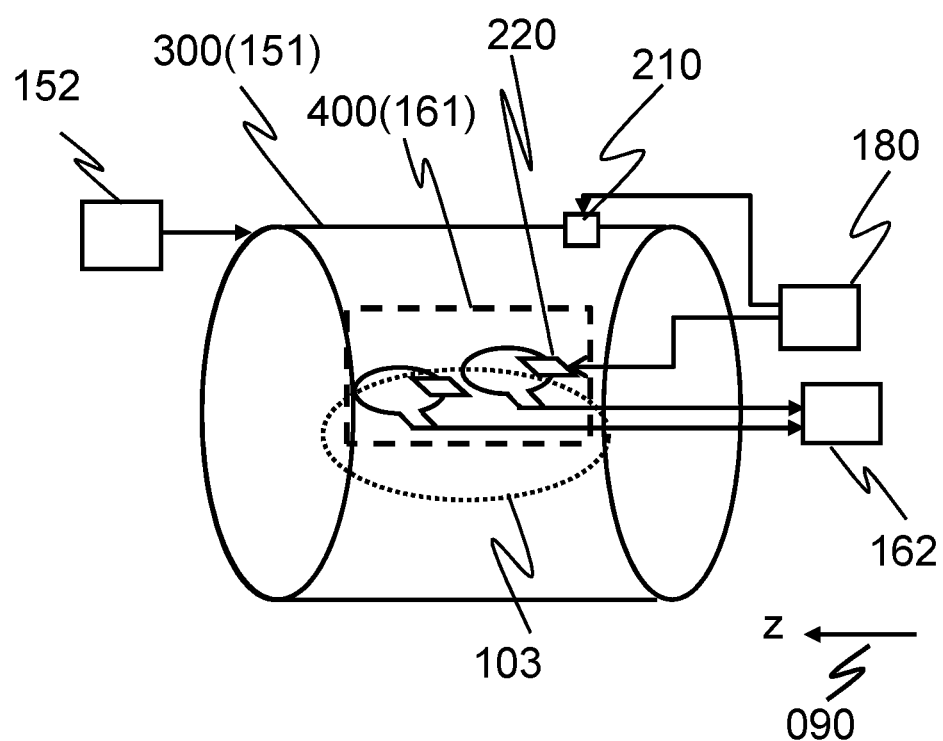
FIG. 3 is a diagram illustrating connection between a transmitting RF coil and a receiving RF coil in the MRI apparatus according to the first embodiment of the invention.

As illustrated in FIG. 3, the birdcage RF coil 300 has a substantially cylinder-shaped appearance (which includes an elliptical pillar or a polygonal pillar) and is arranged such that an axis of the cylindrical pillar is coaxial with a center axis (an axis in the Z direction) of the magnet 110. An examinee 103 is disposed inside the birdcage RF coil 300. The array coil 400 is disposed close to the examinee 103 inside the birdcage RF coil 300. As described above, the birdcage RF coil 300 is connected to the RF magnetic field generator 152. The array coil 400 is connected to the receiver 162.

The birdcage RF coil 300 includes a magnetic coupling preventing circuit 210 that prevents magnetic coupling to the array coil 400. The magnetic coupling preventing circuit 210 is a circuit that prevents magnetic coupling between the transmitting RF coil 151 (the birdcage RF coil 300) and the receiving RF coil 161 (the array coil 400) and is referred to as a transmitting-receiving magnetic coupling preventing circuit 210. The transmitting-receiving magnetic coupling preventing circuit 210 is inserted in series into a straight conductor 301 (details of which will be described later) of the birdcage RF coil 300.

The array coil 400 includes a magnetic coupling preventing circuit 220 that prevents magnetic coupling to the birdcage RF coil 300. The magnetic coupling preventing circuit 220 is a transmitting-receiving magnetic coupling preventing circuit that prevents magnetic coupling between the transmitting RF coil 151 (the birdcage RF coil 300) and the receiving RF coil 161 (the array coil 400). The transmitting-receiving magnetic coupling preventing circuit 220 is inserted in series into each surface coil constituting the array coil 400.

The magnetic coupling preventing circuit driving device 180 is connected to the transmitting-receiving magnetic coupling preventing circuits 210 and 220. By using the transmitting-receiving magnetic coupling preventing circuits 210 and 220, transmission of an RF magnetic field and reception of a nuclear magnetic resonance signal are possible without being magnetically coupled to each other in the above-mentioned arrangement of the transmitting RF coil 151 and the receiving RF coil 161 as illustrated in FIG. 3.

[Transmitting RF Coil]

The birdcage RF coil 300 which is used as the transmitting RF coil 151 according to this embodiment will be described below with reference to FIGS. 4A and 4B.

The birdcage RF coil 300 according to this embodiment is adjusted such that a resonance frequency thereof is the resonance frequency of an element to be excited (magnetic resonance frequency), and emits an RF magnetic field of the magnetic resonance frequency. In this embodiment, the resonance frequency is adjusted to the magnetic resonance frequency f0 of a hydrogen nucleus at which hydrogen nuclei can be excited as described above. In the following description, the magnetic resonance frequency of an RF magnetic field which is emitted is defined as f0.

Figure 4A:
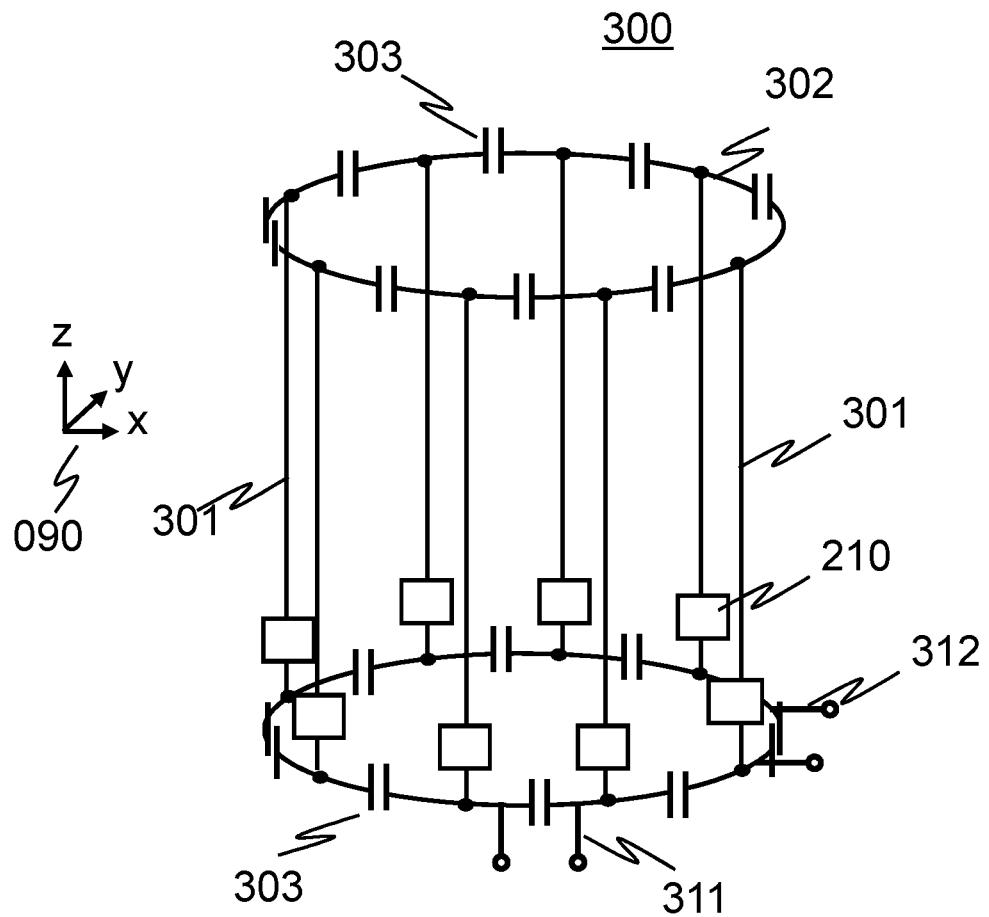
FIG. 4A is a diagram illustrating a configuration of a birdcage RF coil which is used as the transmitting RF coil and FIG. 4B is a diagram illustrating an example of a transmitting-receiving magnetic coupling preventing circuit of the transmitting RF coil.

FIG. 4A is a block diagram illustrating the configuration of the birdcage RF coil 300 according to this embodiment. The birdcage RF coil 300 according to this embodiment includes a plurality of straight conductors 301, end conductors 302 that connect ends of the straight conductors 301, and capacitors 303 that are inserted into the end conductors 302.

The birdcage RF coil 300 includes two input ports 311 and 312. Transmission signals with phases different by 90 degrees are input to the first input port 311 and the second input port 312, and the birdcage RF coil 300 is configured to efficiently apply an RF magnetic field to the examinee 103. As described above, the transmitting-receiving magnetic coupling preventing circuit 210 that prevents magnetic coupling to the receiving RE coil 161 (the array coil 400) is inserted in series in the straight conductors 301 of the birdcage RF coil 300.

Figure 4B:
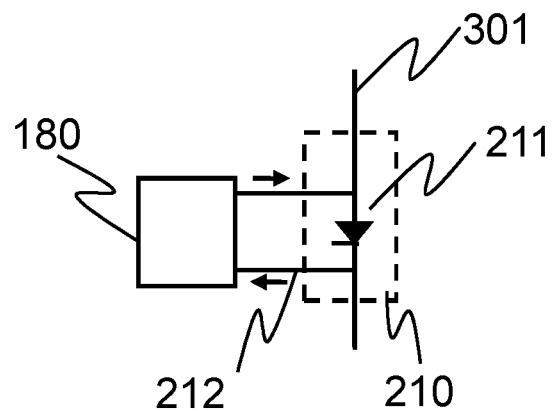

The transmitting-receiving magnetic coupling preventing circuit 210 includes a PIN diode 211 and a control signal line 212, for example, as illustrated in FIG. 4B. The PIN diode 211 is inserted in series into the straight conductor 301, and the control signal line 212 is connected to both ends of the PIN diode 211. The control signal line 212 is connected to the magnetic coupling preventing circuit driving device 180. A choke coil is inserted into the control signal line 212 in order to avoid mixing of RF waves. The control signal line 212 is connected to the magnetic coupling preventing circuit driving device 180. It is preferable that a choke coil (not illustrated) be inserted into the control signal line 212 in order to avoid mixing of RF waves.

The PIN diode 211 has characteristics that it normally exhibits high resistance (OFF) and is substantially turned on (ON) when a value of a DC current flowing forward in the PIN diode 211 is equal to or greater than a predetermined value. In this embodiment, ON/OFF of the PIN diode 211 is controlled with a DC current output from the magnetic coupling preventing circuit driving device 180 using these characteristics. That is, when an RF signal is transmitted, a control current for turning on the PIN diode 211 flows therein via the control signal line 212 and the birdcage RF coil 300 functions as the transmitting RF coil 151. When a nuclear magnetic resonance signal is received, the control current is stopped and the birdcage RF coil 300 is switched to an open state in which impedance thereof is high.

In this way, in this embodiment, by controlling the DC current (the control current) from the magnetic coupling preventing circuit driving device 180, the birdcage RF coil 300 serves as the transmitting RF coil 151 at the time of transmitting an RF signal and is switched to the open state to remove magnetic coupling to the array coil 400 which is the receiving RF coil 161.

[Receiving RF Coil]

The receiving RF coil 161 according to this embodiment will be described below with reference to FIGS. 5A to 6B.

Figure 5A:
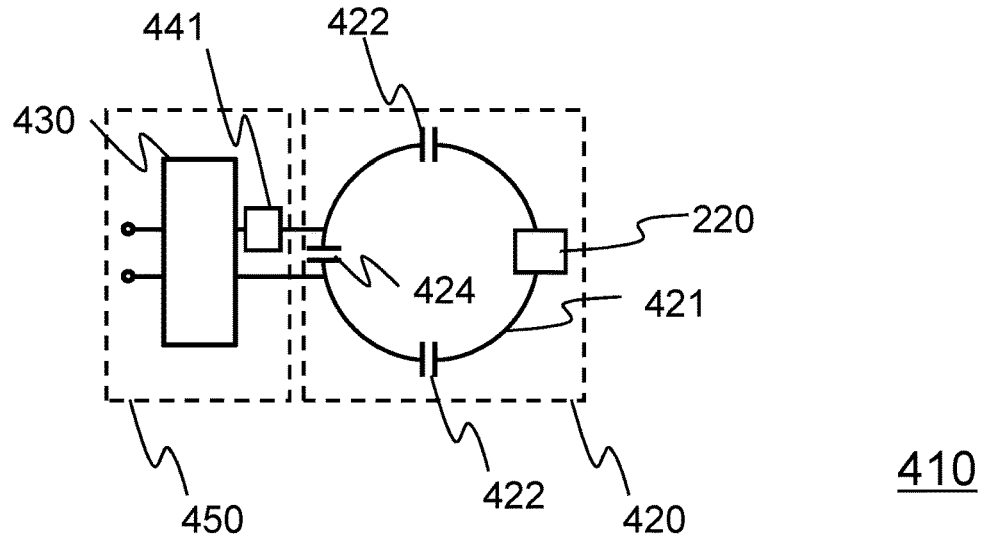
FIGS. 5A to 5C are diagrams illustrating a sub-coil which is employed for the array coil according to the first embodiment of the invention, where
Figure 5B:
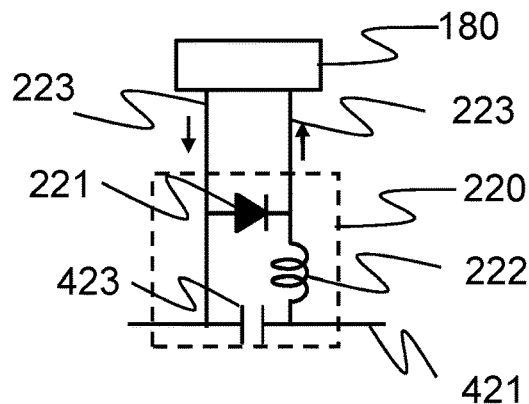
Figure 5C:
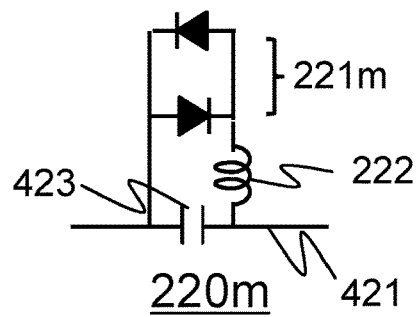

FIGS. 5A to 5C illustrate one sub-coil 410 constituting the array coil 400 which is the receiving RF coil 161. A sub-coil 410 is a surface coil having a loop, and includes a loop coil portion 420 that receives a nuclear magnetic resonance signal and a power supply board portion 450.

The loop coil portion 420 includes a loop 421 in which a conductor having flexibility with a predetermined length is curved, a series capacitor 422, a magnetic coupling preventing circuit 220, and a parallel capacitor 424. The loop 421 forms an almost circular shape when there is no external load and is deformed depending on a direction of a load as illustrated in FIGS. 5A to 5C. The series capacitor 422 is inserted in series into an inductor component of the loop 421 and adjusts the resonance frequency. In FIGS. 5A to 5C, two series capacitors 422 are provided, but the number of series capacitors 422 has only to be equal to or greater than 1. The parallel capacitor 424 is inserted in series into the inductor component of the loop 421, and a parallel resonance circuit is constituted by the inductor component and the parallel capacitor 424.

The power supply board portion 450 includes a low-(input) impedance signal processing circuit 430 and a magnetic coupling adjusting unit 441 serving as an adjustment circuit element. The magnetic coupling adjusting unit 441 includes at least one of a capacitor or an inductor and connects the loop coil portion 420 to the low-impedance signal processing circuit 430.

In this way, the sub-coil 410 according to this embodiment includes the magnetic coupling adjusting unit 441 serving as an adjustment circuit element, the series capacitor 422 that is inserted in series into an inductor component of the loop 421, and the parallel capacitor 424 that is inserted in series into the inductor component and allows the loop coil portion 420 to function as a parallel resonance circuit.

One terminal on the loop coil portion 420 side of the low-impedance signal processing circuit 430 is connected to one end of the parallel capacitor 424 of the loop coil portion 420 via the magnetic coupling adjusting unit 441. The other terminal on the loop coil portion 420 side of the low-impedance signal processing circuit 430 is connected to the other end of the parallel capacitor 424 of the loop coil portion 420. The other terminal of the low-impedance signal processing circuit 430 other than the loop coil portion 420 side is connected to the receiver 162 via a transmission cable.

The transmitting-receiving magnetic coupling preventing circuit 220 removes magnetic coupling to the birdcage RF coil 300 which is the transmitting RF coil 151.

Removal of magnetic coupling between the transmitting RF coil 151 (the birdcage RF coil 300) and the receiving RF coil 161 (the array coil 400) by the transmitting-receiving magnetic coupling preventing circuit 220 will be described below.

FIG. 5B is a circuit diagram illustrating the configuration of the transmitting-receiving magnetic coupling preventing circuit 220 which is inserted into the loop 421 and the connection relationship between the transmitting-receiving magnetic coupling preventing circuit 220 and the magnetic coupling preventing circuit driving device 180.

The transmitting-receiving magnetic coupling preventing circuit 220 includes a PIN diode 221, an inductor 222, and a control signal line 223. The PIN diode 221 and the inductor 222 are connected in series to each other, and is connected in parallel to a capacitor 423. The capacitor 423 is a capacitor that is inserted into the loop 421. The control signal lines 223 are connected to both ends of the PIN diode 221, and the control signal lines 223 are connected to the magnetic coupling preventing circuit driving device 180. A choke coil is inserted into the control signal lines 223 in order to avoid mixing of RF waves (not illustrated). The inductor 222 and the capacitor 423 are adjusted to response in parallel at the frequency of a received nuclear magnetic resonance signal.

A parallel resonance circuit generally has characteristics that it has high impedance (high resistance) at a resonance frequency. Accordingly, when a current flow in the PIN diode 221, the PIN diode 221 is turned on and the capacitor 423 of the loop 421 resonates in parallel with the inductor 222 at the frequency of the received nuclear magnetic resonance signal and becomes a high-impedance state. Accordingly, at the frequency of the received nuclear magnetic resonance signal, a part of the loop coil portion 420 has high impedance and becomes an open state, and the sub-coil 410 including the loop coil portion 420 also becomes an open state.

When a current flows in the PIN diode 221 and thus the PIN diode 221 is turned on in this way, magnetic coupling between each sub-coil 410 and the birdcage RF coil 300 is removed. Accordingly, magnetic coupling between the array coil 400 having the sub-coils 410 as coil elements and the birdcage RF coil 300 is also removed.

The number of transmitting-receiving magnetic coupling preventing circuits 220 which are inserted into the sub-coil 410 is not limited thereto. Two or more transmitting-receiving magnetic coupling preventing circuits may be inserted into each loop 421. By inserting a plurality of transmitting-receiving magnetic coupling preventing circuits, magnetic coupling can be satisfactorily removed.

The transmitting-receiving magnetic coupling preventing circuit 220 is not limited to the above-mentioned configuration. For example, as in a modified example of a transmitting-receiving magnetic coupling preventing circuit 220m illustrated in FIG. 5C, a cross diode 221m may be used instead of the PIN diode 221. Accordingly, when a large signal current flows in a conductor constituting the loop 421, the cross diode 221m is turned on, and the capacitor 423 of the loop 421 resonates in parallel with the inductor 222 at the frequency of the received nuclear magnetic resonance signal and becomes a high-impedance state. In this case, the magnetic coupling preventing circuit driving device 180 may not be provided.

[Arrangement of Coil Casing and Sub-Coil]

Figure 6A:
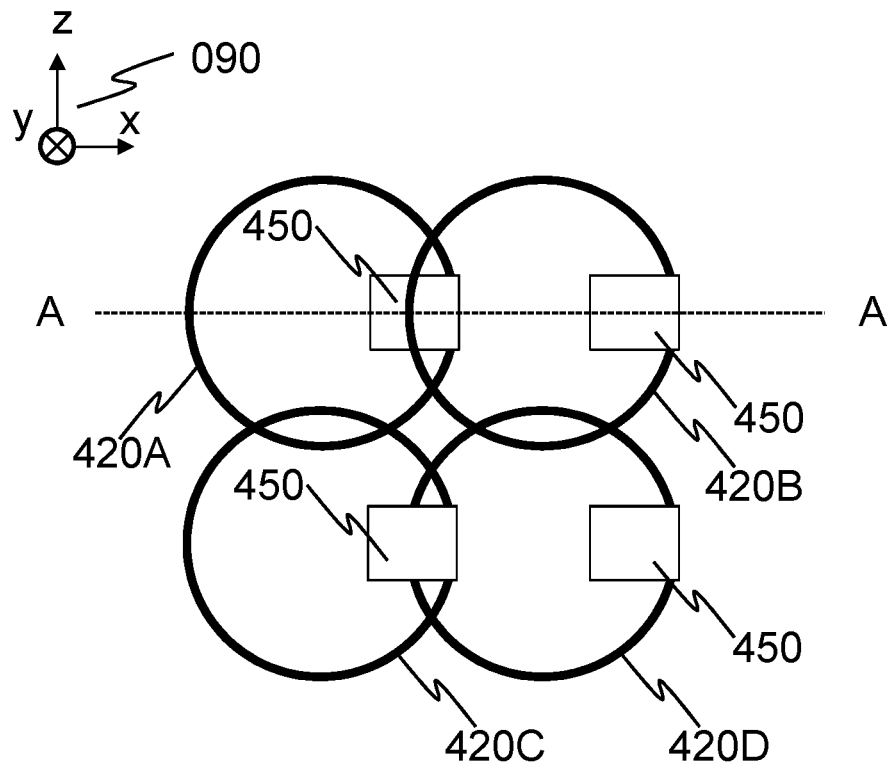
FIG. 6A is a front view illustrating an arrangement example of sub-coils in the array coil according to the first embodiment of the invention and FIG. 6B is a sectional view taken along line A-A in FIG. 5A.
Figure 6B:
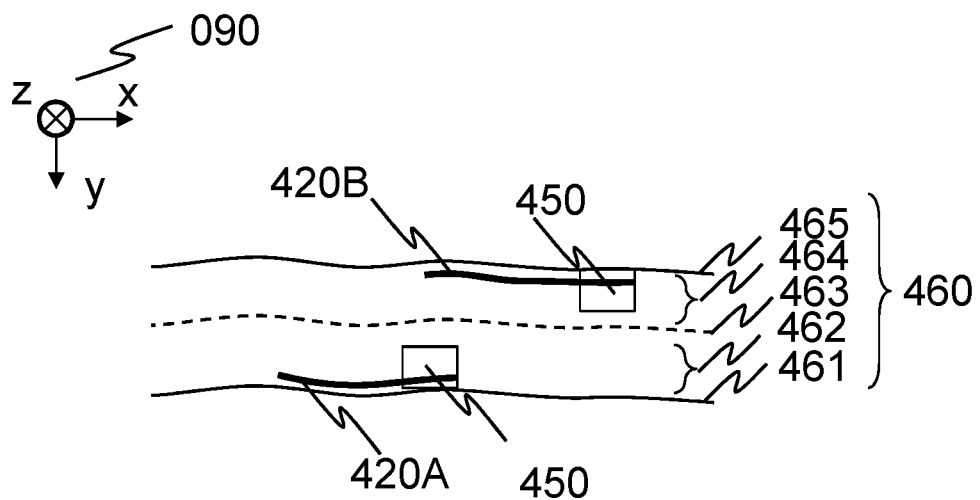

As illustrated in FIGS. 6A and 6B, the receiving RF coil according to this embodiment is an array coil in which a coil unit including a plurality of sub-coils 410 is accommodated in a coil casing 460.

An array coil which is the receiving RF coil according to this embodiment will be described below with reference to FIGS. 6A and 6B. The array coil includes a coil unit including a plurality of sub-coils 410 and a coil casing 460 that accommodates the coil unit therein. For the purpose of convenience of explanation, four sub-coils 410 included in the coil unit are illustrated in FIGS. 6A and 6B.

Each sub coil includes a loop coil portion 420 (four loop coil portions are discriminated by loop coil portions 420A, 420B, 420C, and 420D in the following description) and a power supply board portion 450. A loop 421 of the loop coil portion 420 is formed by curving a conductor having flexibility with a constant length in an almost circular shape and the shape thereof varies depending on the situation. For example, a coated copper wire with a diameter of 1 mm can be employed as the loop coil portion 420.

The coil casing 460 is formed in a bag shape out of a sheet-like material such as a fabric, rubber, or polymer film which can expand and contract in at least one direction. In this embodiment, the coil casing 460 is formed in a bag shape by sewing or bonding ends of a sheet-like material cut into a single sheet and accommodates the coil unit to enclose the coil unit.

A state in which the coil unit is accommodated in the coil casing 460, that is, the internal configuration of the coil casing 460, will be described with reference to FIG. 6B.

FIG. 6B illustrates a sectional view taken along line A-A crossing the loop coil portion 420A and the loop coil portion 420B in FIG. 6A.

The coil casing 460 includes a first coil casing surface 461 and a second coil casing surface 465 which are substantially parallel to each other. A collision preventing surface 463 that is substantially parallel to the first coil casing surface 461 is disposed between the first coil casing surface 461 and the second coil casing surface 465. A first arrangement space 462 is formed between the first coil casing surface 461 and the collision preventing surface 463, and a second arrangement space 464 is formed between the collision preventing surface 463 and the second coil casing surface 465.

The first coil casing surface 461, the second coil casing surface 465, and the collision preventing surface 463 employ a material having flexibility. Here, a material which can expand and contract in the x direction and the z direction in FIGS. 6A and 6B is employed.

The sub-coils 410 of the coil unit are alternately arranged in the first arrangement space 462 and the second arrangement space 464 in the direction in which the coil casing 460 expands and contracts. In FIG. 6A, the loop coil portion 420A and the loop coil portion 420D are arranged in the first arrangement space 462, and the loop coil portion 420B and the loop coil portion 420C are arranged in the second arrangement space 464. Each loop coil portion 420 is connected to the corresponding power supply board portion 450. The power supply board portion 450 arranged in the first arrangement space 462 is bonded to the first coil casing surface 461, and the power supply board portion 450 arranged in the second arrangement space 464 is bonded to the second coil casing surface 465. Each sub-coil 410 is fixed to the coil casing 460 via the power supply board portion 450.

The array coil has a configuration in which the coil unit is accommodated in the coil casing 460 having flexibility. Accordingly, for example, when an examination target region is an abdomen, it is possible to flexibly cope with different sizes of examinees. FIGS. 7A to 9B illustrate arrangement examples of the array coil 400 according to this embodiment.

Figure 7A:
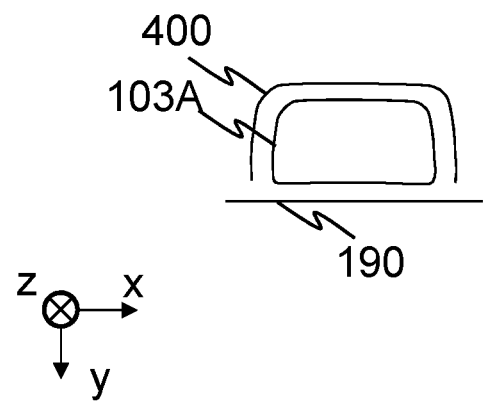
FIGS. 7A and 7B are diagrams illustrating an arrangement example for an examinee when the array coil according to the first embodiment of the invention is used, where
Figure 7B:
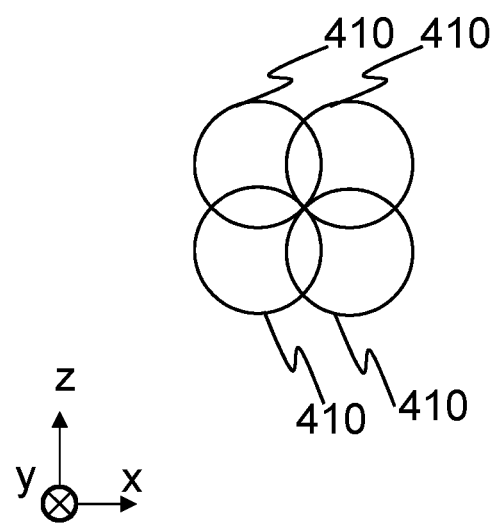
Figure 8A:
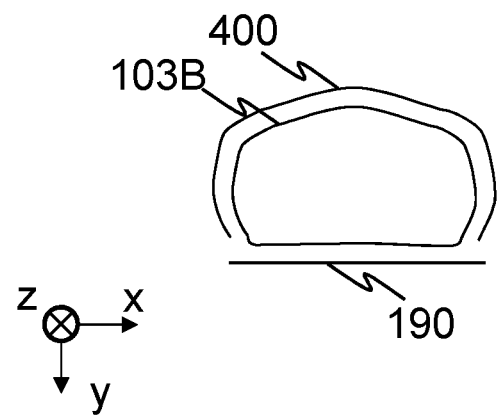
FIGS. 8A and 8B are diagrams illustrating an arrangement example for an examinee when the array coil according to the first embodiment of the invention is used, where
Figure 8B:
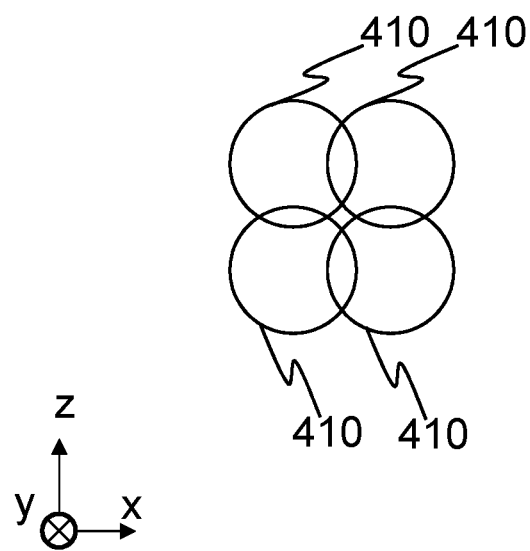
Figure 9A:
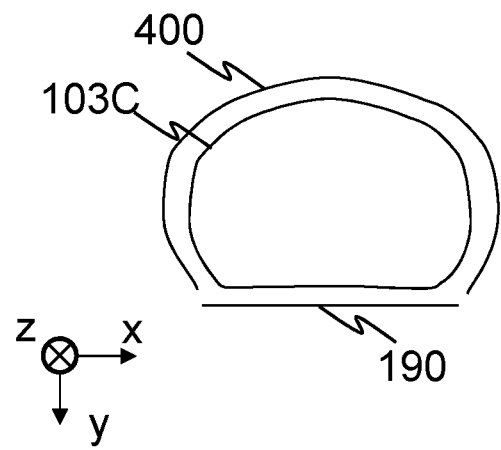
FIGS. 9A and 9B are diagrams illustrating an arrangement example for an examinee when the array coil according to the first embodiment of the invention is used, where
Figure 9B:
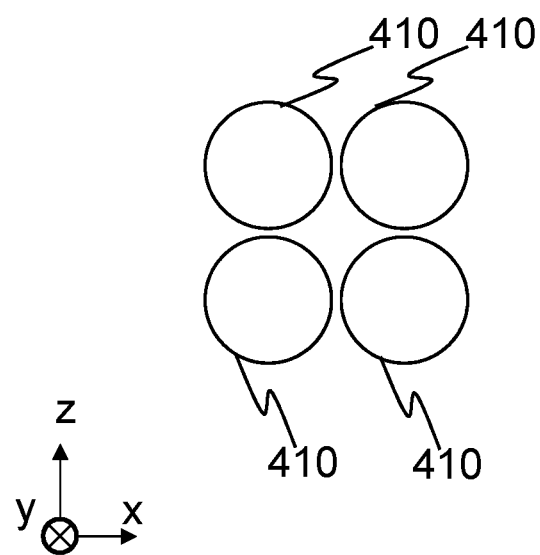

FIGS. 7A and 7B illustrate an example in which an examinee size is smaller than the coil length, FIGS. 8A and 8B illustrate an example in which an examinee size is suitable for the coil length, and FIGS. 9A and 9B illustrate an example in which an examinee size is greater than the coil length. FIGS. 7A, 8A, and 9A illustrate sectional views perpendicular to a body axis direction, where an examinee is lying on the examinee's back, a negative y-axis direction is directed to the abdomen side, and a positive y-axis direction is directed to the back side. The array coil 400 is arranged on the abdomen side, and a spinal receiving coil 190 incorporated into a bed is arranged on the back side.

Since the coil length of the array coil 400 can be appropriately changed by causing the coil casing 460 of the array coil 400 to expand and contract, the array coil 400 can be arranged along the biological structures of examinees in the vicinity of the examinees even when the examinees have different sizes. Specifically, even when the size is smaller like an examinee 103A illustrated in FIG. 7A, the array coil 400 and the spinal receiving coil 190 can exactly cover the surrounding of an abdominal section without overlapping each other and thus it is possible to prevent a decrease in image quality due to deterioration of coil performance.

Even when the size is greater like an examinee 103C illustrated in FIG. 9A, the surrounding of the abdominal section can be covered without a gap without forming a gap between the array coil 400 and the spinal receiving coil 190 and it is possible to curb a signal loss due to the gap and to prevent a decrease in image quality.

In the sub-coils 410, the inter-center distance between the loop coil portions of the sub-coils in the coil casing 460 varies with expansion and contraction of the coil casing 460. When the examinee size is smaller as illustrated in FIG. 7B, the sub-coils 410 are densely arranged and the inter-center distance between the sub-coils 410 decreases. As the examinee size increases, the gap between the sub-coils 410 increases and the inter-center distance between the sub-coils 410 increases as illustrated in FIGS. 8B and 9B.

In this way, since each sub-coil 410 is fixed to the coil casing 460 via the power supply board portion 450 and the coil casing 460 expands and contract uniformly, the density with which the sub-coils 410 are arranged can be uniformly changed with respect to the change of the coil length. That is, without forming a gap in which the arrangement density is extremely small between the sub-coils 410, the surrounding of the abdominal section can be covered uniformly without any gap. Accordingly, a signal loss due to the gap is not caused, and it is possible to prevent a decrease in image quality.

Since the loop 421 of each sub-coil is formed of a conductor having flexibility with a varying shape, the loops vary in a shape along an examination region of an examinee 103 and enables a close arrangement. Accordingly, it is possible to improve signal acquisition efficiency and to enhance image quality. Since each loop 421 is a conductor with a constant length and is not deformed in the length direction thereof, electrical characteristics are not changed even with deformation of the array coil, and it is possible to prevent shift in resonance frequency or deterioration of the conductor and to prevent a decrease in image quality.

Since the coil casing 460 can expand and contract, the array coil 400 according to this embodiment can be arranged in close contact with or close to an examinee 103 without folding the coil casing. Accordingly, since magnetic coupling between the sub-coils can be prevented, it is possible to prevent a decrease in image quality.

[Capacitance of Parallel Capacitor]

A capacitance of the parallel capacitor 424 of each sub-coil 410 constituting a coil unit 490 will be described below.

The capacitance of the parallel capacitor 424 is adjusted such that impedance of the loop coil portion 420 at the resonance frequency of the parallel resonance circuit when seen from the low-impedance signal processing circuit 430 is equal to characteristic impedance (for example, 50Ω) of a transmission cable connected to the low-impedance signal processing circuit 430 when the coil casing 460 is arranged in close contact with a body part of an examinee.

By this adjustment, impedance at both ends of the parallel capacitor 424, that is, block impedance, can be improved. Here, the transmission cable connected to the low-impedance signal processing circuit 430 is a transmission cable that connects the receiving RF coil 161 to the receiver 162 in FIGS. 2 and 3, and serves to transmit an output signal from the low-impedance signal processing circuit 430 of the receiving RF coil 161 to the receiver 162.

The parallel capacitor 424 performs a function of converting impedance. As the distance between the loop coil portion 420 and an examination object 103 decreases, a biological load increases and the capacitance of the parallel capacitor 424 decreases to adjust the impedance of the resonance circuit.

The resonance circuit including the magnetic coupling adjusting unit 441 and the parallel capacitor 424 is adjusted to resonate in series at the frequency of the received nuclear magnetic resonance signal when seen from the low-impedance signal processing circuit 430. When the resonance circuit is seen from both ends of the parallel capacitor 424, a parallel resonance circuit is constructed and the impedance at both ends of the parallel capacitor 424 is referred to as block impedance.

The block impedance can be expressed by Expression (1).

[Math. 1]

$$Zblock = \frac{1}{\omega^2 + Cm^2 + Z_{in}} \quad (1)$$

Here, $\omega$ denotes an angular frequency relative to a nuclear magnetic resonance frequency, Cm denotes the capacitance of the parallel capacitor 424, and Zin denotes input impedance of the low-impedance signal processing circuit 430.

As the distance between the loop coil portion 420 and an examinee 103 decreases, the value of Cm decreases and thus the block impedance can be improved by the configuration capable of realizing close arrangement. Accordingly, it is possible to improve a magnetic coupling preventing function between the sub-coils and to prevent a decrease in image quality.

Since the input impedance of the low-impedance signal processing circuit 430 is low, the block impedance at the resonance frequency increases. Accordingly, when seen from another sub-coil 410, a part of the loop coil portion 420 of the sub-coil 410 has high impedance and prevents magnetic coupling between the sub-coils.

As described above, in the array coil serving as the receiving RF coil according to this embodiment, it is possible to flexibly cope with different sizes of examinees by causing the coil casing 460 to expand and contract. That is, with the array coil according to this embodiment, since the array coil can be made to approach an examinee and can be arranged along the biological structure of the examinee regardless of the size of the examinee, it is possible to provide an MRI image with high image quality regardless of the size of an examinee.

Since the sub-coils adjacent to each other in the array coil are arranged in different arrangement spaces in the expanding and contracting direction of the coil casing 460, it is possible to prevent physical collision between the loops 421 and to smoothly change the positional relationship therebetween. It is possible to shorten the time for installing the receiving coil in an examinee due to the smooth change and to reduce an installer's burden.

The array coil 400 has flexibility and thus can be arranged close to various shapes, and one array coil 400 can be applied to various body regions. Accordingly, a plurality of array coils do not need to be prepared for regions of an examination object and it is possible to reduce the number of receiving coils dedicated for the regions and thus to reduce costs.

In this embodiment, the first coil casing surface 461, the second coil casing surface 465, and the collision preventing surface 463 are formed of materials having flexibility, but the configurations thereof are not limited thereto. For example, an expandable and contractible structure may be provided in combination of rigid bodies. In this case, it is possible to enhance durability.

In this embodiment, the power supply board portion 450 arranged in the first arrangement space 462 is bonded to the first coil casing surface 461 and the power supply board portion 450 arranged in the second arrangement space 464 is bonded to the second coil casing surface 465, but the configuration is not limited thereto. For example, the power supply board portion 450 arranged in the first arrangement space 462 may be bonded to the collision preventing surface 463 and the power supply board portion 450 arranged in the second arrangement space 464 may be bonded to the collision preventing surface 463. Accordingly, it is possible to improve a degree of freedom in arrangement.

In this embodiment, adjustment of the capacitance of the parallel capacitor 424 is not limited to the above-mentioned value. In the above-mentioned example, in arrangement of the coil casing 460 in close contact with a body part of an examination object, the impedance of the loop coil portion 420 at the resonance frequency of the parallel resonance circuit when seen from the low-impedance signal processing circuit 430 is adjusted to be equal to the characteristic impedance of the transmission cable connected to the low-impedance signal processing circuit 430. However, the capacitance of the parallel capacitor 424 may be less than that and thus possible to improve the block impedance.

In this embodiment, the array coil 400 is arranged on the abdomen of the examinee 103, but the target region may be, for example, a head or each limb. In this case, the same advantages can be obtained.

Modified Example

In the first embodiment, the coil casing 460 of the array coil 400 can expand and contract in two directions of the x-axis direction and the z-axis direction in FIGS. 7A to 8B, but the expanding and contracting direction of the coil casing 460 may be only one direction of the x-axis direction.

By alternately arranging the sub-coils 410 in the first arrangement space 462 and the second arrangement space 464 in FIG. 6B in the expanding and contracting direction, it is possible to smoothly change the coil length similarly to the first embodiment.

In the direction in which the coil casing 460 does not expand and contract, since the sub-coils 410 may be arranged in any of the first arrangement space 462 and the second arrangement space 464, it is possible to improve a degree of freedom in arrangement. As illustrated in FIGS. 6A, 7B, 8B, and 9B, in the first embodiment, the coil unit in which the centers of sub-coils adjacent to an arbitrary sub-coil are arranged at an angle of 90 degrees with respect to the center of the arbitrary sub-coil has been described above. The arrangement of sub-coils is not limited thereto, and the centers of sub-coils adjacent to an arbitrary sub-coil may be arranged, for example, at an angle of 60 degrees with respect to the center of the arbitrary sub-coil. Accordingly, by increasing the arrangement density of the sub-coils, it is possible to improve the image quality of an MRI image.

In addition, the coil casing is formed of a sheet of sheet-like material, but may be formed in a bag by connecting a plurality of sheets of materials. At this time, by using a plurality of materials of which the extending and contracting direction is one direction as sub-casings and connecting the plurality of sub-casings such that the expanding and contracting directions thereof are not match each other, the coil casing can be made to expand and contract in a plurality of directions as a whole. For example, when the sub-casings are connected to form a coil casing such that the expanding and contracting directions thereof are perpendicular to each other, the coil casing can be made to expand and contract in two axis directions as a whole.

Second Embodiment

A second embodiment of the invention will be described below.

The entire configuration of an MRI apparatus according to this embodiment is the same as the configuration of the first embodiment and thus description thereof will not be repeated. Similarly to the first embodiment, in this embodiment, a direction of a static magnetic field which is generated by a horizontal magnetic field type magnet 110 is defined as a z-axis direction of the coordinate system 090.

A coil unit of an array coil according to this embodiment is different from the coil unit according to the first embodiment, in that the sub-coils are arranged more densely, a collision preventing surface is not provided in the coil casing, and each sub-coil is arranged in one arrangement space such that the sub-coil has an inclined surface with respect to the coil casing.

The coil unit according to this embodiment will be described below with reference to FIGS. 10A and 10B and FIGS. 11A and 11B.

A sub-coil constituting the coil unit according to this embodiment includes a loop coil portion 720, a power supply board portion 750, a power supply board support portion 751, and a loop support portion 752.

The loop coil portion 720 is formed in a substantially circular shape by curving a conductor having flexibility with a constant length and the shape can be changed depending on the situation. In this embodiment, a flexible print board formed of a conductor of copper with a thickness of 30 μm and a width of 5 mm is curved to form the loop coil portion 720.

Figure 10A:
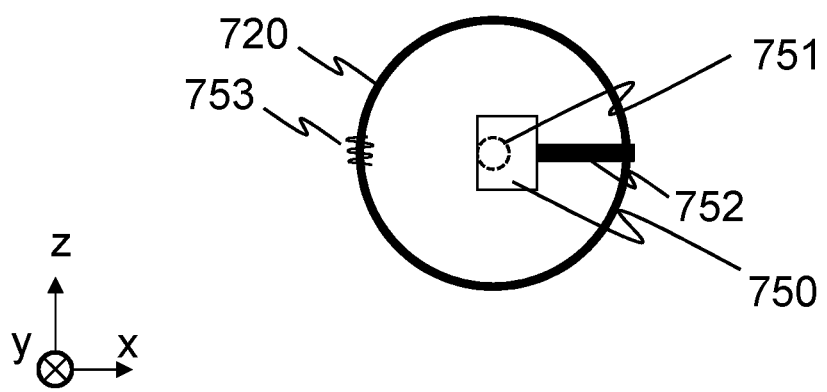
FIGS. 10A and 10B are diagrams illustrating a configuration of a sub-coil which is included in an array coil according to a second embodiment of the invention, where
Figure 10B:
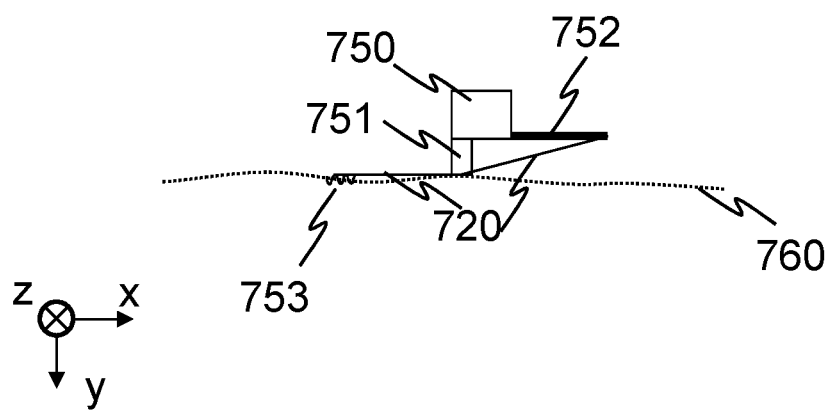

As illustrated in FIGS. 10A and 10B, the loop coil portion 720 is bonded to a coil casing 760 via a loop bonding portion 753. At least one position of the loop coil portion 720 (a part facing the loop bonding portion 753 in this embodiment) is fixed to the loop support portion 752 and is connected to the power supply board portion 750 via the loop support portion 752. The power supply board portion 750 is connected to the loop support portion 752 such that it is located at the substantially center of the loop coil portion 720.

One end of the power supply board support portion 751 is connected to the power supply board portion 750 and the other end of the power supply board support portion 751 comes into contact with the coil casing 760, whereby the power supply board portion 750 and the loop coil portion 720 are supported by the coil casing 760. The power supply board support portion 751 and the coil casing 760 are in contact with each other but are not bonded to each other.

The loop coil portion 720 is bonded to the coil casing 760 via the loop bonding portion 753, and a part of the loop coil portion 720 facing the loop bonding portion 753 is connected to the power supply board portion 750 via the loop support portion 752, whereby the loop coil portion 720 includes a portion which is gradually inclined in a direction in which it is spaced away from the coil casing 760. Here, a half of the loop coil portion 720 is configured to be spaced away from the coil casing 760.

In this way, each sub-coil 710 has a configuration in which the power supply board support portion 751, the power supply board portion 750, the loop support portion 752, and the loop coil portion 720 are unified, and this unified configuration is bonded to the coil casing 760 via only the loop bonding portion 753.

Figure 11A:
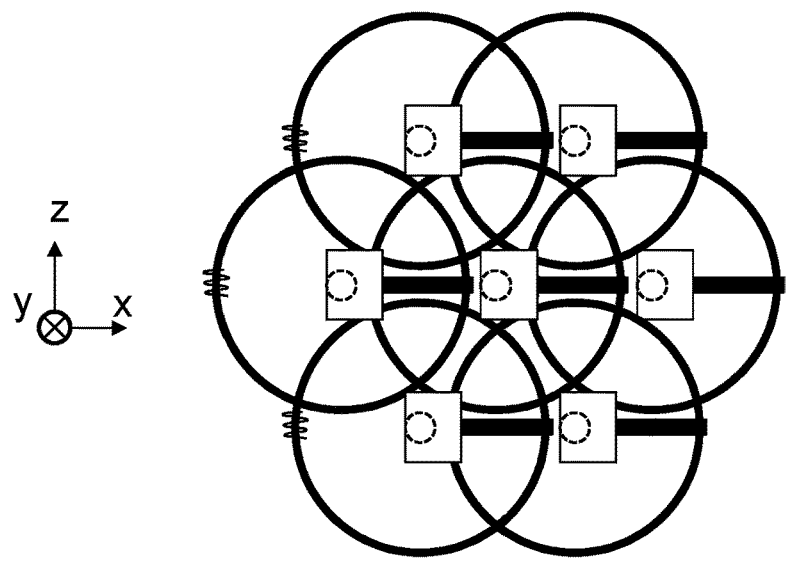
FIGS. 11A and 11B are diagrams illustrating arrangement examples of sub-coils which are included in the array coil according to the second embodiment of the invention, where
Figure 11B:
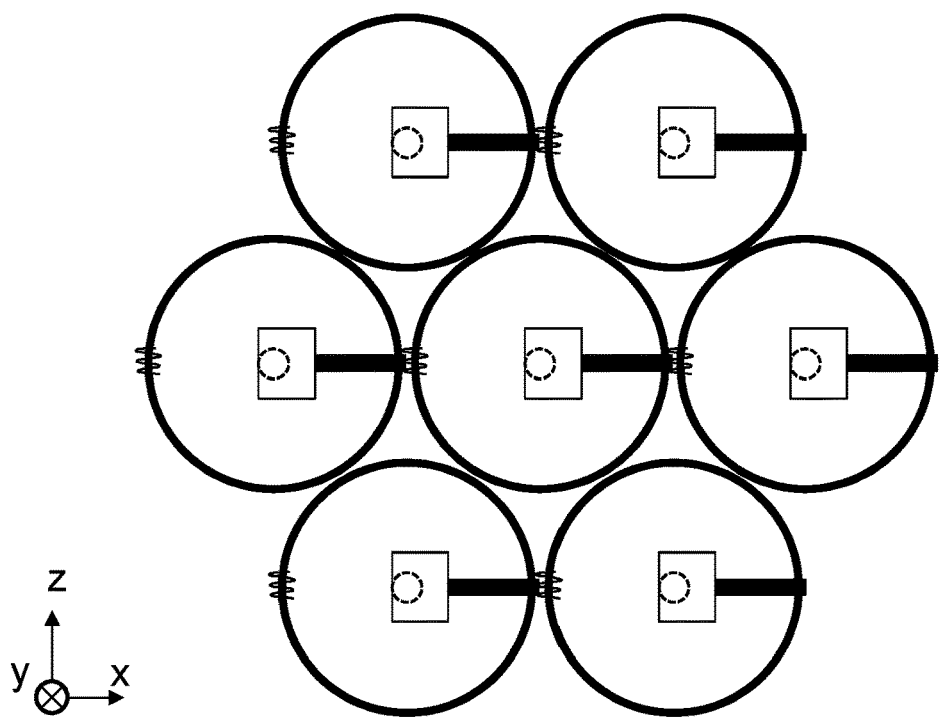

FIGS. 11A and 11B illustrate an arrangement relationship between seven sub-coils 710 included in a coil unit. In FIGS. 11A and 11B, six sub-coils are arranged around a sub-coil located at the center at an angle of 60 degrees when seen from the sub-coil at the center. It is assumed that the coil casing 760 can expand and contract in the x-axis direction and the z-axis direction.

Change of a shape when the coil casing 760 expands and contracts in the array coil having the above-mentioned configuration will be described below.

Since the power supply board support portion 751 is not bonded to the coil casing 760, each sub coil 710 slides with respect to the coil casing 760 when the coil casing 760 expands and contracts. FIG. 11A illustrates a state in which the coil casing 760 contracts and FIG. 11B illustrates a state in which the coil casing 760 expands.

FIGS. 11A and 11B illustrate a state in which the inter-center distance of the loops along the coil casing changes.

Since the conductor of the loop coil portion 720 has a small thickness and the loop coil portion 720 is configured to be partially spaced away from the coil casing 760, the sub-coils do not interfere with or physically collide with each other even when the state illustrated in FIG. 11B in which the coil casing 760 expands and the sub-coils 710 do not overlap each other is changed to the state illustrated in FIG. 11A in which the coil casing 760 contracts.

With the array coil having the above-mentioned configuration, since the coil length of the array coil can be appropriately changed by causing the coil casing 760 to expand and contract, the array coil can be arranged in the vicinity of examinees having different sizes along the biological structures of the examinees and it is possible to provide an MRI image with high image quality regardless of the examinee size.

Since a collision preventing surface does not need to be provided in the coil casing in comparison with the first embodiment, it is possible to reduce the number of components and the number of manufacturing processes and thus to contribute to a decrease in cost. Since all the sub-coils of the array coil can be arranged in the same space of the coil casing, all the sub-coils can be arranged in the vicinity of an examinee and it is thus possible to improve signal acquisition efficiency.

Modified Example

In the array coil according to the second embodiment, the loop coil portion 720 is formed of a flexible printed board, but the material of the loop coil portion 720 has only to be a conductive material having flexibility and, for example, a copper wire coated with a shape memory material can be employed. An example of a coil unit in this case will be described below with reference to FIGS. 12A to 15.

In FIGS. 12A to 12D and FIG. 13, for the purpose of convenience of description, two sub-coils 810 included in a coil unit are illustrated. A loop coil portion 820 of each sub-coil is formed in an almost circular shape by curving a copper wire coated with a shape memory material. Since the loop coil portion 820 employs a shape memory material, the loop coil portion 820 is deformed when a physical force is applied thereto from the outside and is returned to the original circular shape when the force disappears.

Figure 13:
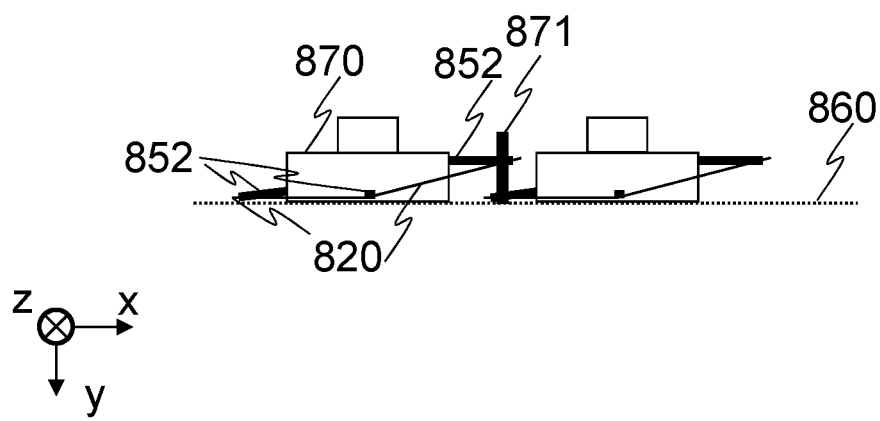
FIG. 13 is a side view illustrating an arrangement example of sub-coils in an array coil according to a modified example of the second embodiment of the invention.

The loop coil portion 820 is supported by loop support portions 852 which are provided in a radial shape from an approach suppressing portion 870 arranged at the center of the loop coil portion 820. Six loop support portions 852 are provided radially at angles of 60 degrees from the center of the approach suppressing portion 870, and some loop support portions 852 are supported at a position slightly spaced away from the coil casing 860 (FIG. 13). Accordingly, the loop coil portion 820 includes a part which is inclined with respect to the coil casing 860.

The approach suppressing portion 870 is a pillar having a fixed radius from the center of the loop coil portion 820, and is formed of, for example, hard plastic. Here, the approach suppressing portion 870 also serves as a power supply board support portion. The power supply board (not illustrated) is supported by the approach suppressing portion 870. Herein, the approach suppressing portion 870 is bonded to the coil casing 860, and the loop coil portion 820 is not bonded to the coil casing 860.

In an area in which neighboring sub-coils 810 overlap each other, an overlap maintaining portion 871 is provided to be included in both the two neighboring loop coil portions. More specifically, the overlap maintaining portion 871 is a pillar-shaped member which is bonded to the coil casing 860 at the middle position between the loop coil portions 820 of the neighboring sub-coils 810 and is formed of, for example, hard plastic with a diameter of 1 mm.

When the loop coil portion 820 in the array coil having the above-mentioned configuration physically comes into contact with the approach suppressing portion 870 of the coil casing 860, the loop coil portion 820 is deformed along the shape of the approach suppressing portion 870. FIGS. 12A to 12D illustrate the states of shape change when the coil casing 860 contracts gradually and the neighboring loop coil portions 820 get closer to each other. When the inter-center distance between the neighboring loop coil portions 820 decreases, the loop coil portion 820 comes into contact with the approach suppressing portion 870 and is deformed. Accordingly, the overlap area between the loop coil portions 820 does not increase excessively and magnetic coupling between the sub-coils can be prevented. Therefore, it is possible to prevent deterioration in coil performance of the sub-coils and to prevent a decrease in image quality of an MRI image.

Figure 12A:
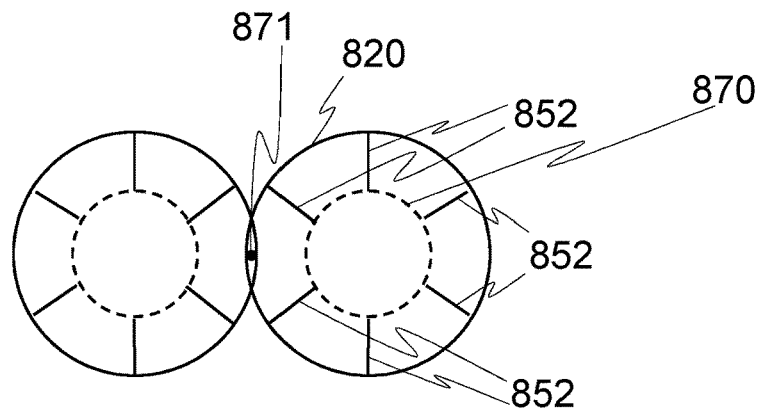
FIGS. 12A to 12D are diagrams illustrating an arrangement example of sub-coils which are included in the array coil according to the second embodiment of the invention and illustrating a state in which the coil casing contracts gradually from FIG. 12A to FIG. 12D.
Figure 12B:
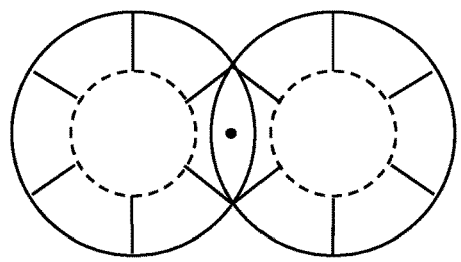
Figure 12C:
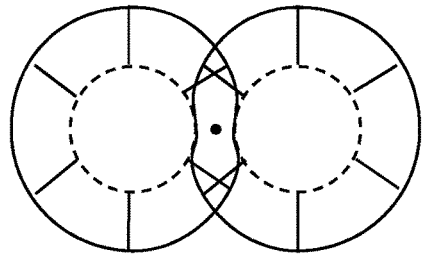
Figure 12D:
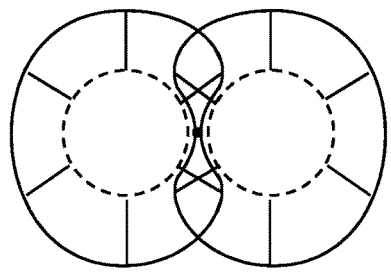

By providing the overlap maintaining portion 871 as illustrated in FIG. 12A, an increase of the inter-center distance between the loop coil portions 820 is prevented even when the coil casing 860 expands. Accordingly, the loop coil portions of neighboring sub-coils are arranged to have an area in which they overlap each other, and there is an overlap area in an expandable and contractible area of the coil casing even when the inter-center distance of the loop coil portions increases. Accordingly, it is possible to prevent magnetic coupling between the sub-coils, to prevent deterioration in coil performance of the sub-coils, and to prevent a decrease in image quality.

As illustrated in FIG. 13, since some of the loop support portions 852 are inclined with respect to the coil casing 860 and are spaced away from the coil casing 860 and the neighboring loop coil portions 820 are arranged to overlap each other when seen in the y-axis direction, the loop coil portions 820 do not contact each other even when the coil casing 860 contracts, and smooth change of the coil length is possible.

According to this modified example, since the coil length of the array coil can be appropriately changed by allowing the coil casing 860 to expand and contract, the array coil can be arranged in the vicinity of examinees having different sizes along the biological structures of the examinees and it is possible to provide an MRI image with high image quality regardless of the size of an examinee.

Since the overlap area between the neighboring loop coil portions 820 can be maintained within a predetermined range by the approach suppressing portions 870 and the overlap maintaining portions 871 which are provided in the loop coil portions 820, the coil performance due to magnetic coupling between the sub-coils can be controlled within an allowable range of deterioration. Particularly, this is effective when a magnetic field strength is relatively small and the capacitance of the parallel capacitor cannot be decreased.

In this modified example, the approach suppressing portion 870 is a pillar also serving as a power supply board support portion, but the structure is not limited thereto. For example, the approach suppressing portion 370 may be a hollow pillar and the power supply board support portion may be separately provided. Instead of one pillar, a plurality of plates may be arranged with a predetermined distance from the center of the loop coil portion 820 at intervals. Accordingly, it is possible to reduce an amount of hard plastic and to reduce the weight.

In this modified example, the overlap maintaining portion 871 is provided, but the overlap maintaining portion 871 may not be provided. For example, the overlap maintaining portion 871 may not be provided and an expansion limit of the coil casing 860 may be set to a state in which the loop coil portions are adjacent to each other. Accordingly, similarly to the case in which there is an overlap maintaining portion 871, the loop coil portions of the sub-coils are arranged to have a partial overlap area therebetween, that is, the expandable and contractible area of the coil casing is limited to a range in which there is an overlap area. Accordingly, when the coil casing 860 contracts, the loop coil portions do not come into contact with each other by physical contact and smooth change of the coil length is possible.

As described above, two sub-coils included in the array coil are illustrated in FIGS. 12A to 12D and FIG. 13 for the purpose of convenience of description, but the number of sub-coils can be appropriately determined. For example, the number of sub-coils may be 7 or 32. When the number of sub-coils is large and the sizes of the sub-coils are the same, the sensitivity in a broader range can be obtained. Alternatively, when the number of sub-coils is large and the sizes of the coil units are the same, the loop size of the sub-coils decreases and thus it is possible to improve surface sensitivity.

Figure 14:
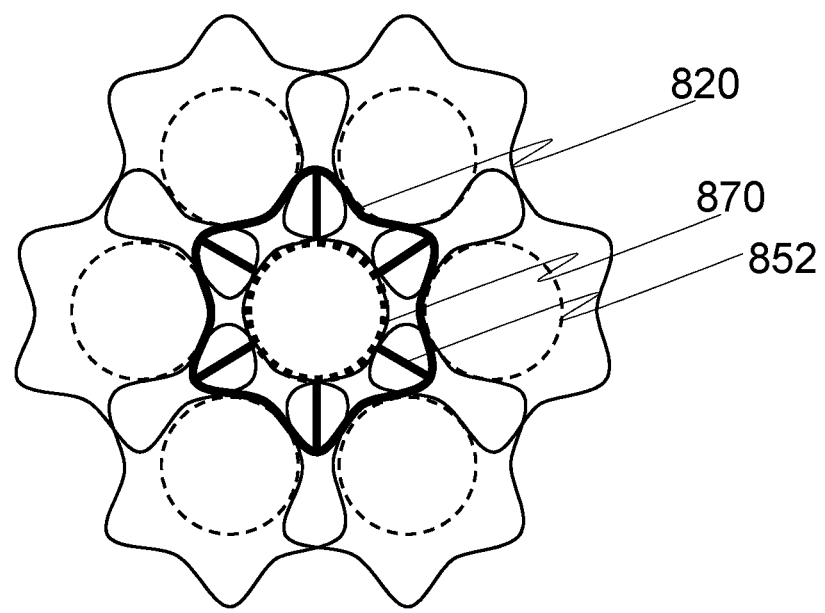
FIG. 14 is a diagram illustrating an arrangement example of sub-coils when the coil casing contracts in the array coil according to the modified example of the second embodiment of the invention.
Figure 15:
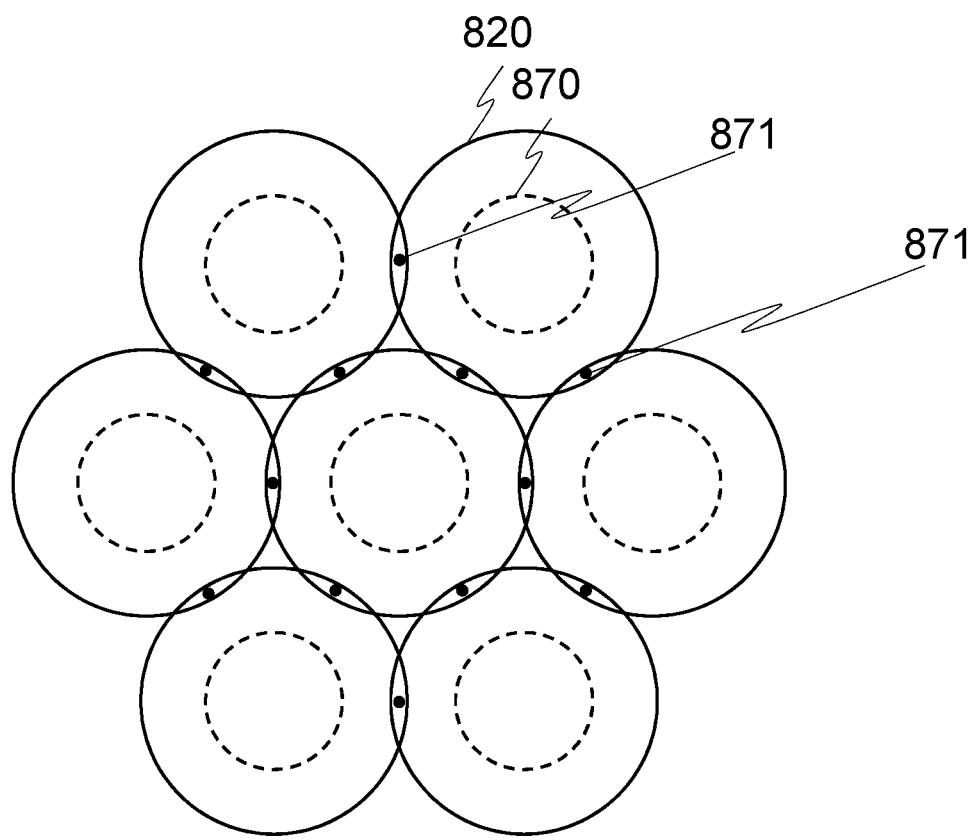
FIG. 15 is a diagram illustrating an arrangement example of sub-coils when the coil casing expands in the array coil according to the modified example of the second embodiment of the invention.
Figure 16A:
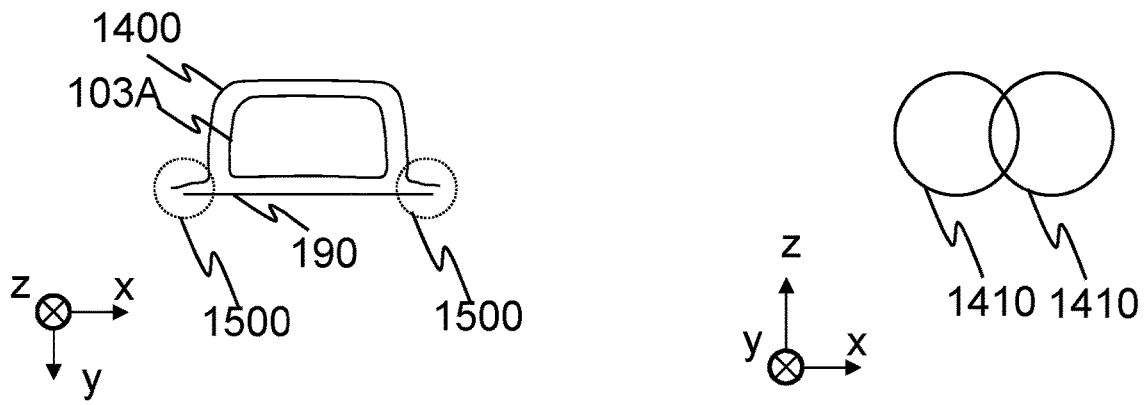
FIGS. 16A to 16O are sectional views perpendicular to a body axis direction of an examinee associated with an arrangement example when a flexible coil with a fixed coil length is arranged with respect to abdomens of other examinees having different sizes in an MRI apparatus according to the related art, where
Figure 16B:
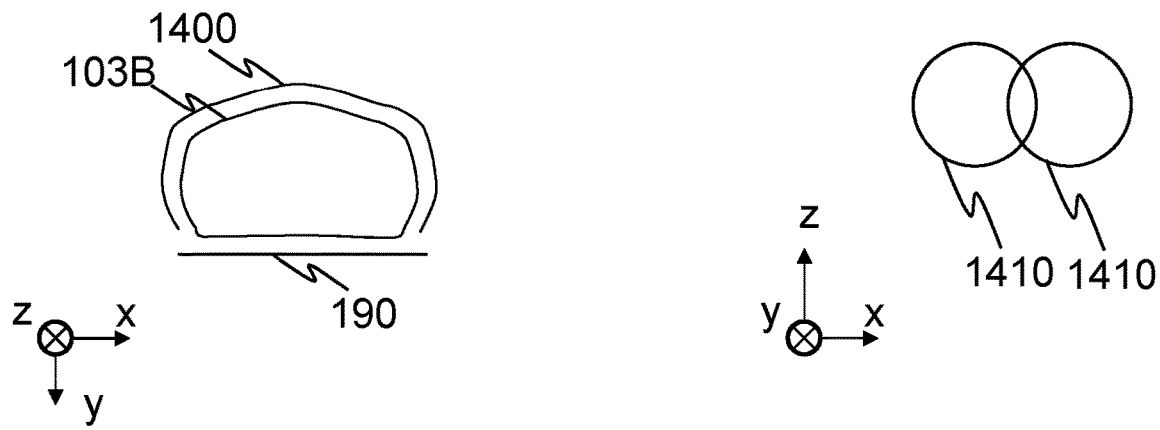
FIG. 16B illustrates a sectional view (the left part) and a positional relationship between some sub-coils when an examinee size is suitable for a coil length.
Figure 16C:
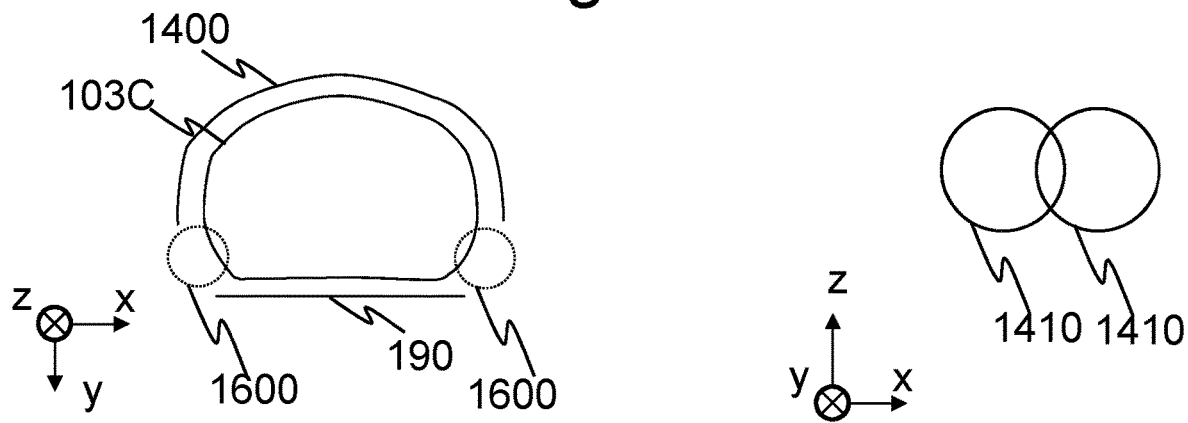

In FIGS. 14 and 15, an arrangement example of seven sub-coils out of the sub-coils included in the array coil is illustrated. FIG. 14 illustrates a state in which the coil casing 860 contracts, and the loop support portions 852 are arranged at angle positions other than the angle positions at which the neighboring approach suppressing portions 870 are arranged and are deformed in a shape close to a hexagon. Accordingly, even when the inter-center distance between the loop coil portions 820 decreases, the overlap area does not increase excessively, and thus it is possible to prevent magnetic coupling between the sub-coils, to prevent deterioration in coil performance of the sub-coils, and prevent a decrease in image quality.

FIG. 15 illustrates a state in which the coil casing 860 expands in the array coil. Even when the inter-center distance between the loop coil portions increases, the overlap area does not disappear due to the overlap maintaining portion 871 and thus it is possible to prevent magnetic coupling between the sub-coils. Accordingly, it is possible to prevent deterioration in coil performance of the sub-coils and to prevent a decrease in image quality. When the coil casing 860 contracts, the loop coil portions do not come into contact with each other and thus smooth change of the coil length is possible.

What is claimed is:

1. An array coil comprising:
a coil unit in which a plurality of sub-coils which includes a loop coil portion in which a conductor having flexibility with a predetermined length is curved and which is adjusted to receive a magnetic resonance signal from an examinee are arranged at predetermined intervals; and
a coil casing that is formed of a sheet-shaped material which expands and contracts in at least one direction and accommodates the coil unit therein,
wherein at least one position of each of the plurality of sub-coils is fixed to the coil casing and an inter-center distance between the sub-coils varies with expansion and contraction of the coil casing,
wherein the coil casing includes:
a first casing surface and a second casing surface that are arranged substantially parallel to each other; and
a collision preventing surface that is arranged substantially parallel to the first casing surface and the second casing surface between the first casing surface and the second casing surface, and
wherein the sub-coils of the coil unit are alternately arranged in a first space that is formed between the first casing surface and the collision preventing surface and a second space that is formed between the second casing surface and the collision preventing surface in an expanding and contracting direction of the coil casing.

2. The array coil according to claim 1, wherein each sub-coil further includes a low-impedance signal processing circuit and a magnetic coupling adjusting unit,
wherein the loop coil portion includes a parallel capacitor that is inserted in series into an inductance component and causes the loop coil portion to function as a parallel resonance circuit,
wherein one terminal of the parallel capacitor is connected directly to one terminal of the low-impedance signal processing circuit and the other terminal of the parallel capacitor is connected to the other terminal of the low-impedance signal processing circuit via the magnetic coupling adjusting unit, and
wherein a capacitance of the parallel capacitor is determined such that the impedance at a resonance frequency of the parallel resonance circuit is equal to or less than a characteristic impedance of a transmission cable through which an output signal from the low-impedance signal processing circuit is transmitted when the coil casing is arranged along a biological structure of the examinee.

3. The array coil according to claim 1, wherein the coil casing expands and contracts in a radial direction.

4. The array coil according to claim 1, wherein the coil casing has a configuration in which at least two sub-casings expanding and contracting in the at least one direction are connected such that the expanding direction and the contracting direction thereof are different from each other, and
wherein the coil casing expands and contracts in at least two directions as a whole.

5. The array coil according to claim 1, wherein each sub-coil includes a pillar portion that is in contact with the coil casing surface and supports a part of the loop coil portion, and
wherein the loop coil portion of each sub-coil is arranged such that a part of the loop coil portion includes a part which is inclined with respect to the coil casing surface by fixing a part of the loop coil portion directly to the coil casing surface and supporting another part thereof on the coil casing surface via the pillar portion.

6. The array coil according to claim 1, wherein each sub-coil includes a pillar portion that is fixed to the coil casing surface with a center position thereof matching that of the loop coil portion and that has a radius less than that of the loop coil portion, and
wherein, when the coil casing contracts, the loop coil portions of the neighboring sub-coils are in contact with the pillar portions and the loop coil portions are deformed along a shape of the pillar portion.

7. The array coil according to claim 1, wherein the neighboring sub-coils of the coil unit are arranged to have an overlap area in the same plane, and
wherein an overlap maintaining pillar that limits an inter-center distance between the sub-coils to a predetermined range is disposed in the overlap area.

8. A magnetic resonance imaging apparatus comprising:
a static magnetic field forming unit that forms a static magnetic field;
a gradient magnetic field forming unit that forms a gradient magnetic field;
a transmitting RF coil that irradiates an examination object placed in the static magnetic field with an RF magnetic field;
a receiving RF coil that detects a nuclear magnetic resonance signal from the examination object; and
a signal processing unit that processes the nuclear magnetic resonance signal detected by the receiving RF coil,
wherein the receiving RF coil is an array coil comprising:
a coil unit in which a plurality of sub-coils which includes a loop coil portion in which a conductor having flexibility with a predetermined length is curved and which is adjusted to receive a magnetic resonance signal from an examinee are arranged at predetermined intervals; and
a coil casing that is formed of a sheet-shaped material which expands and contracts in at least one direction and accommodates the coil unit therein,
wherein at least one position of each of the plurality of sub-coils is fixed to the coil casing and an inter-center distance between the sub-coils varies with expansion and contraction of the coil casing,
wherein the coil casing includes:
a first casing surface and a second casing surface that are arranged substantially parallel to each other; and
a collision preventing surface that is arranged substantially parallel to the first casing surface and the second casing surface between the first casing surface and the second casing surface, and
wherein the sub-coils of the coil unit are alternately arranged in a first space that is formed between the first casing surface and the collision preventing surface and a second space that is formed between the second casing surface and the collision preventing surface in an expanding and contracting direction of the coil casing.

9. An array coil comprising:
a coil unit in which a plurality of sub-coils which includes a loop coil portion in which a conductor having flexibility with a predetermined length is curved and which is adjusted to receive a magnetic resonance signal from an examinee are arranged at predetermined intervals; and a coil casing that is formed of a sheet-shaped material which expands and contracts in at least one direction and accommodates the coil unit therein, wherein at least one position of each of the plurality of sub-coils is fixed to the coil casing and an inter-center distance between the sub-coils varies with expansion and contraction of the coil casing, wherein the coil casing has a configuration in which at least two sub-casings expanding and contracting in the at least one direction are connected such that the expanding direction and the contracting direction thereof are different from each other, and wherein the coil casing expands and contracts in at least two directions as a whole.

10. The array coil according to claim 9, wherein each sub-coil further includes a low-impedance signal processing circuit and a magnetic coupling adjusting unit, wherein the loop coil portion includes a parallel capacitor that is inserted in series into an inductance component and causes the loop coil portion to function as a parallel resonance circuit, wherein one terminal of the parallel capacitor is connected directly to one terminal of the low-impedance signal processing circuit and the other terminal of the parallel capacitor is connected to the other terminal of the low-impedance signal processing circuit via the magnetic coupling adjusting unit, and wherein a capacitance of the parallel capacitor is determined such that the impedance at a resonance frequency of the parallel resonance circuit is equal to or less than a characteristic impedance of a transmission cable through which an output signal from the low-impedance signal processing circuit is transmitted when the coil casing is arranged along a biological structure of the examinee.

11. The array coil according to claim 9, wherein the coil casing includes:

a first casing surface and a second casing surface that are arranged substantially parallel to each other; and a collision preventing surface that is arranged substantially parallel to the first casing surface and the second casing surface between the first casing surface and the second casing surface, the sub-coils of the coil unit are alternately arranged in a first space that is formed between the first casing surface and the collision preventing surface and a second space that is formed between the second casing surface and the collision preventing surface in an expanding and contracting direction of the coil casing.

12. The array coil according to claim 9, wherein the coil casing expands and contracts in a radial direction.

13. The array coil according to claim 9, wherein each sub-coil includes a pillar portion that is in contact with the coil casing surface and supports a part of the loop coil portion, and wherein the loop coil portion of each sub-coil is arranged such that a part of the loop coil portion includes a part which is inclined with respect to the coil casing surface by fixing a part of the loop coil portion directly to the coil casing surface and supporting another part thereof on the coil casing surface via the pillar portion.

14. The array coil according to claim 9, wherein each sub-coil includes a pillar portion that is fixed to the coil casing surface with a center position thereof matching that of the loop coil portion and that has a radius less than that of the loop coil portion, and wherein, when the coil casing contracts, the loop coil portions of the neighboring sub-coils are in contact with the pillar portions and the loop coil portions are deformed along a shape of the pillar portion.

15. The array coil according to claim 9, wherein the neighboring sub-coils of the coil unit are arranged to have an overlap area in the same plane, and wherein an overlap maintaining pillar that limits an inter-center distance between the sub-coils to a predetermined range is disposed in the overlap area.

* * * * *